(12) United States Patent
Obara

(10) Patent No.: US 7,892,893 B2
(45) Date of Patent: Feb. 22, 2011

(54) SEMICONDUCTOR DEVICE AND MANUFACTURING METHOD THEREOF

(75) Inventor: Taichi Obara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 570 days.

(21) Appl. No.: 11/834,902

(22) Filed: Aug. 7, 2007

(65) Prior Publication Data

US 2008/0283983 A1    Nov. 20, 2008

(30) Foreign Application Priority Data

Mar. 26, 2007   (JP) .............................. 2007-079684

(51) Int. Cl.
*H01L 21/48* (2006.01)
*H01L 21/50* (2006.01)
*H01L 23/495* (2006.01)
*H01L 23/04* (2006.01)
*H01L 23/28* (2006.01)

(52) U.S. Cl. ........................ 438/112; 438/123; 438/124; 257/676; 257/730; 257/787

(58) Field of Classification Search ........................ None
See application file for complete search history.

(56) References Cited

U.S. PATENT DOCUMENTS

| | | | |
|---|---|---|---|
| 4,942,455 A * | 7/1990 | Shinohara | 257/666 |
| 5,666,003 A * | 9/1997 | Shibata et al. | 257/796 |
| 5,763,946 A * | 6/1998 | Nakadaira et al. | 257/693 |
| 6,291,880 B1 * | 9/2001 | Ogawa et al. | 257/723 |
| 6,313,598 B1 * | 11/2001 | Tamba et al. | 318/722 |
| 6,597,063 B1 * | 7/2003 | Shimizu et al. | 257/687 |
| 6,727,585 B2 * | 4/2004 | Choi | 257/728 |
| 6,873,042 B2 * | 3/2005 | Ishii et al. | 257/702 |
| 7,074,654 B1 * | 7/2006 | Miks et al. | 438/123 |
| 2001/0052639 A1 | 12/2001 | Jeon et al. | |
| 2002/0145195 A1 * | 10/2002 | Okamoto et al. | 257/720 |
| 2002/0190374 A1 * | 12/2002 | Nakajima et al. | 257/707 |
| 2004/0227231 A1 * | 11/2004 | Maly et al. | 257/724 |
| 2005/0199999 A1 * | 9/2005 | Shirasawa et al. | 257/706 |
| 2007/0215999 A1 * | 9/2007 | Kashimoto et al. | 257/678 |

FOREIGN PATENT DOCUMENTS

| | | |
|---|---|---|
| JP | 9-232512 | 9/1997 |
| JP | 10-22435 | 1/1998 |
| JP | 10-135380 | 5/1998 |
| JP | 2000-323646 | 11/2000 |
| JP | 2002-314038 | 10/2002 |
| KR | 1998-021184 | 6/1998 |
| KR | 2002-0036007 | 5/2002 |

* cited by examiner

*Primary Examiner*—Scott B Geyer
(74) *Attorney, Agent, or Firm*—Oblon, Spivak, McClelland, Maier & Neustadt, L.L.P.

(57) ABSTRACT

A portion of a frame body is fixed on a surface of a heat-radiating plate, and on frame body, a semiconductor chip is die-bonded. Next, a prescribed electrode of semiconductor chip and corresponding lead terminal and the like are electrically connected by a prescribed wire. Next, the lead frame is set in a metal mold such that the semiconductor chip is covered with resin from above the semiconductor chip. Thermoplastic resin is introduced into the metal mold, and semiconductor chip and the like are sealed. By taking out the resulting body from the metal mold, a semiconductor is formed. Thus, a semiconductor device can be provided with reduced manufacturing cost.

8 Claims, 31 Drawing Sheets

SEMICONDUCTOR DEVICE AND MANUFACTURING METHOD THEREOF

BACKGROUND OF THE INVENTION

1. Field of the Invention

The present invention relates to a semiconductor device and manufacturing method thereof and, more specifically, to a semiconductor device including a power semiconductor element and to a method of manufacturing the same.

2. Description of the Background Art

A switching element such as an IGBT (Insulated Gate Bipolar Transistor) is applied to a semiconductor device used, for example, for driving an inverter of industrial equipment. Such a switching element is mounted as a semiconductor chip on a prescribed ceramic substrate. The ceramic substrate having such a semiconductor chip mounted thereon is placed on a heat-radiating plate for radiating heat generated from the semiconductor chip. Around the heat-radiating plate, an insert case is arranged to surround the ceramic substrate. The insert case is formed of resin such as PET-PBT (PolyEthylene Terephetalate)-(PolyButylene Terephtalate), PBT or PPS (PolyPhenylene Sulfide).

A terminal base for connecting the semiconductor device to external equipment is provided on the insert case. The terminal base has a portion provided for supporting (fixing) a nut and a main electrode terminal extending from the ceramic substrate. At this portion, a terminal such as a bus bar connected to the external equipment is to be fixed by a bolt or the like. A semiconductor device of this type is disclosed, for example, in Japanese Patent Laying-Open No. 2002-314038.

The conventional semiconductor device, however, has the following problem. While reduction in manufacturing cost of the semiconductor devices has been demanded, the insert case of the semiconductor device described above is relatively expensive, and it is one factor that hinders reduction of manufacturing cost.

SUMMARY OF THE INVENTION

The present invention was made to solve the above-described problem, and an object of the invention is to provide a semiconductor device of which manufacturing cost can be reduced, and another object is to provide a method of manufacturing such a semiconductor device.

The semiconductor device in accordance with the present invention includes an element-mounting member, a semiconductor chip, a connecting terminal and a sealing resin. On the element-mounting member, a prescribed semiconductor element is mounted. The semiconductor chip is mounted on a prescribed position of the element-mounting member, and includes a prescribed power element as the semiconductor element. The connecting terminal is erected upward at a prescribed position of the semiconductor chip, and is electrically connected to the semiconductor chip. The sealing resin covers, at least from above, the element-mounting member and the semiconductor chip as a whole, and seals the element-mounting member and the semiconductor chip with the erected connecting terminal protruded at the portion covered from above.

The method of manufacturing the semiconductor device in accordance with the present invention includes the following steps of preparing an element-mounting member on which a semiconductor element is mounted; preparing a lead frame including a pattern that is to be a connecting terminal; mounting a semiconductor chip including a prescribed power element as the semiconductor element on the element-mounting member; connecting the semiconductor chip and the connecting terminal by a prescribed metal wire; processing the lead frame such that the connecting terminal is erected upward at a prescribed position on the semiconductor chip; in a prescribed metal mold to which a prescribed sealing resin is to be introduced for sealing the element-mounting member and the semiconductor chip, setting the lead frame and the element-mounting member in such a manner that the element-mounting member and the semiconductor chip as a whole are covered at least from above and the erected connecting terminal is protruded at the portion covered from above; introducing the sealing resin to the metal mold; and taking out the semiconductor chip sealed with the sealing resin, from the metal mold.

According to the semiconductor device of the present invention, the element-mounting member and the semiconductor chip as a whole are covered at least from above, and the erected connecting terminal is protruded at the portion covered from above with the sealing resin. Thus, different from a conventional semiconductor device, an insert case becomes unnecessary, and thus, manufacturing cost for the semiconductor device can be reduced.

According to the method of manufacturing the semiconductor device of the present invention, in a prescribed metal mold to which the sealing resin is to be introduced, the lead frame and the element-mounting member are set such that the element-mounting member and the semiconductor chip as a whole are covered with the sealing resin at least from above and the erected connecting terminal is protruded at the portion covered from above, the sealing resin is introduced to the metal mold in this state, and the element-mounting member and the lead frame are sealed. Thus, different from the conventional semiconductor device, an insert case becomes unnecessary, and thus, manufacturing cost for the semiconductor device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
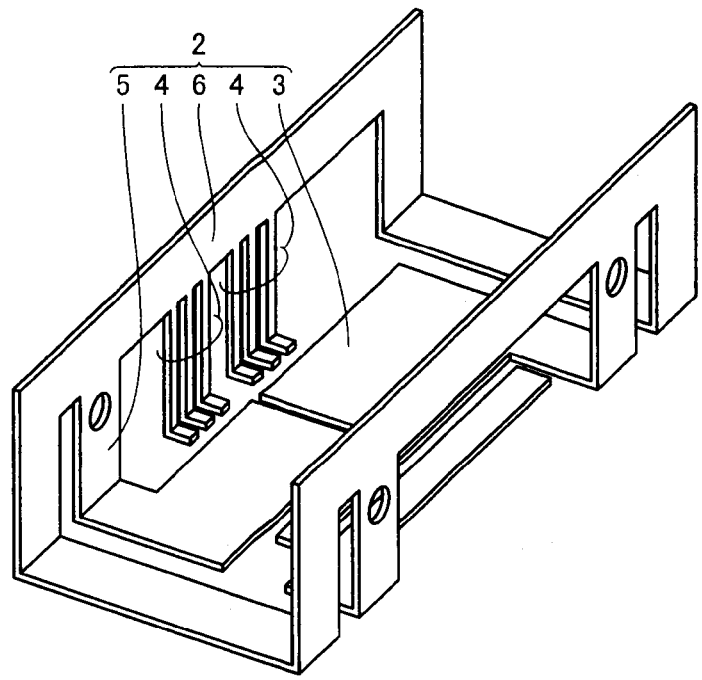
FIG. 1 is a perspective view showing a step of manufacturing a semiconductor device in accordance with Embodiment 1 of the present invention.
Figure 2:
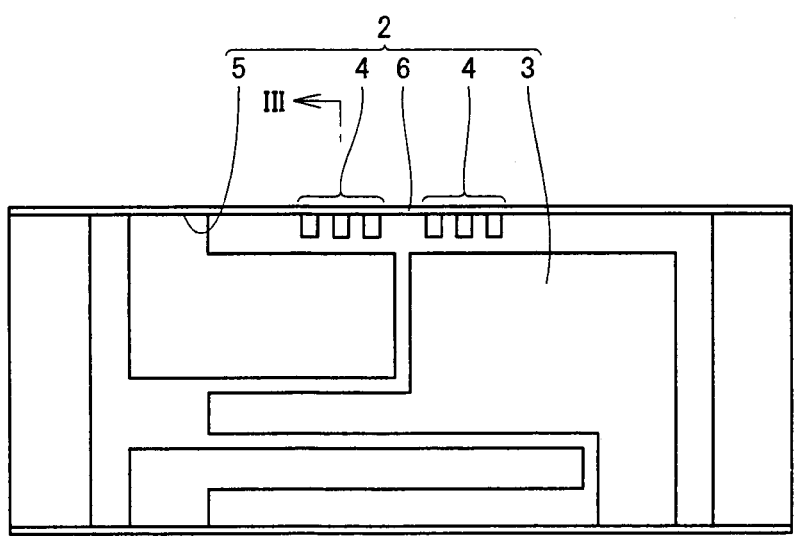
FIG. 2 is a plan view of the step shown in FIG. 1 of Embodiment 1.
Figure 3:
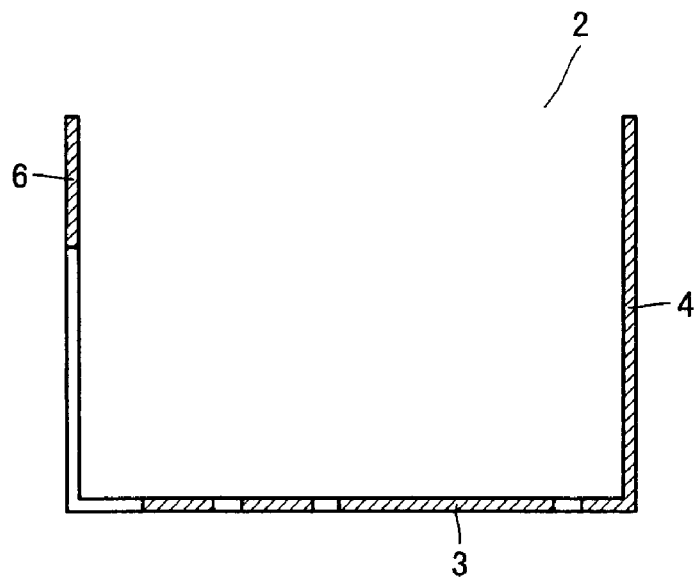
FIG. 3 is a cross-sectional view taken along the line III-III of FIG. 2 of Embodiment 1.

A method of manufacturing a semiconductor device in accordance with Embodiment 1 of the present invention will be described. First, as shown in FIGS. 1, 2 and 3, a lead frame 2 as an element-mounting member is prepared. Lead frame 2 is formed, for example, of a thin plate of copper (Cu), and punched out to a prescribed pattern to provide a portion of frame body 3 on which a semiconductor chip is mounted, a portion to be a lead terminal 4, and a portion to be a main electrode terminal 5. These portions are connected to each other by a tie bar 6. Lead frame 2 as such is bent such that the portion to be lead terminal 4 and the portion to be main electrode terminal 5 are erected upward from frame body 3, at prescribed positions.

Figure 4:
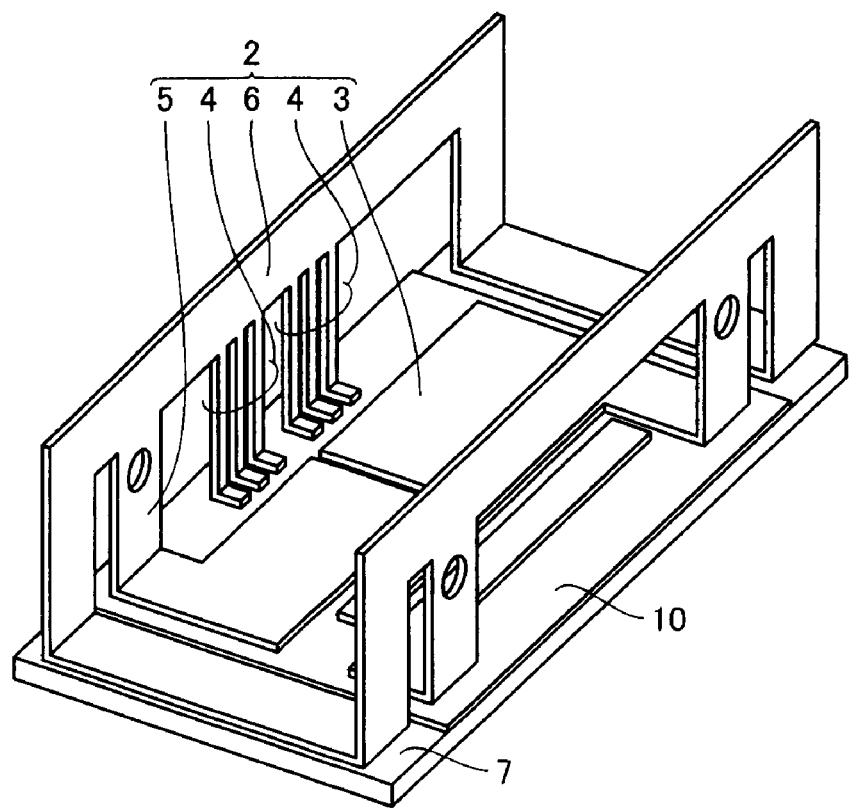
FIG. 4 is a perspective view showing a step performed after the steps shown in FIGS. 1 to 3 of Embodiment 1.
Figure 5:
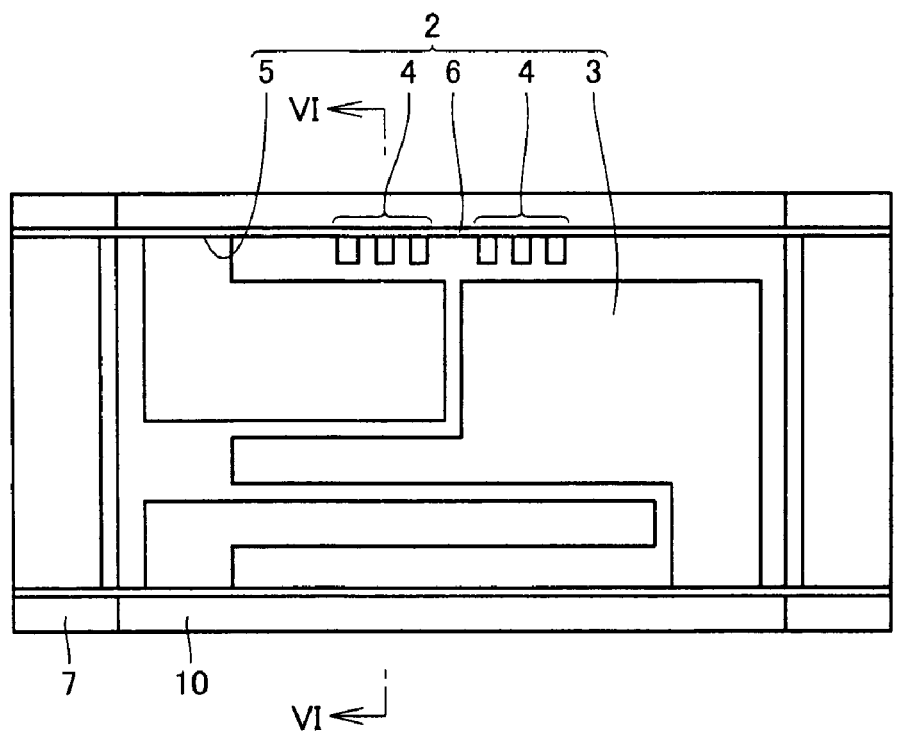
FIG. 5 is a plan view of the step shown in FIG. 4 of Embodiment 1.
Figure 6:
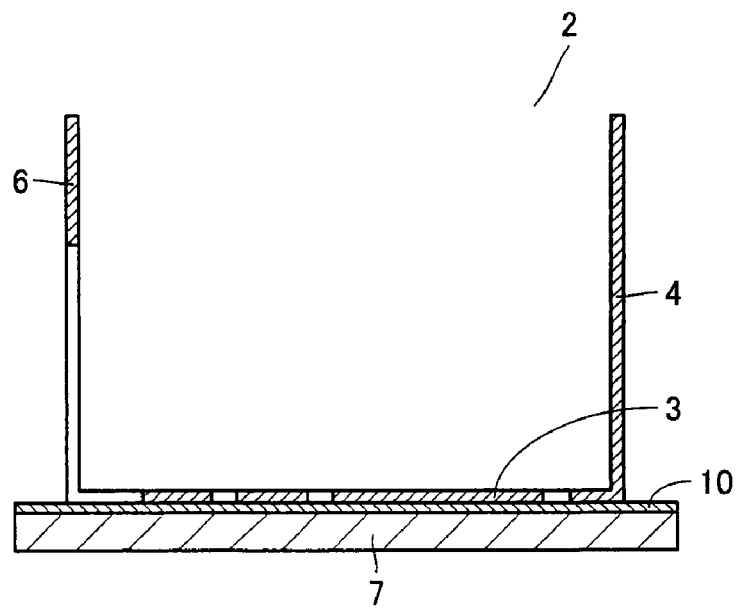
FIG. 6 is a cross-sectional view taken along the line VI-VI shown in FIG. 5 of Embodiment 1.
Figure 7:
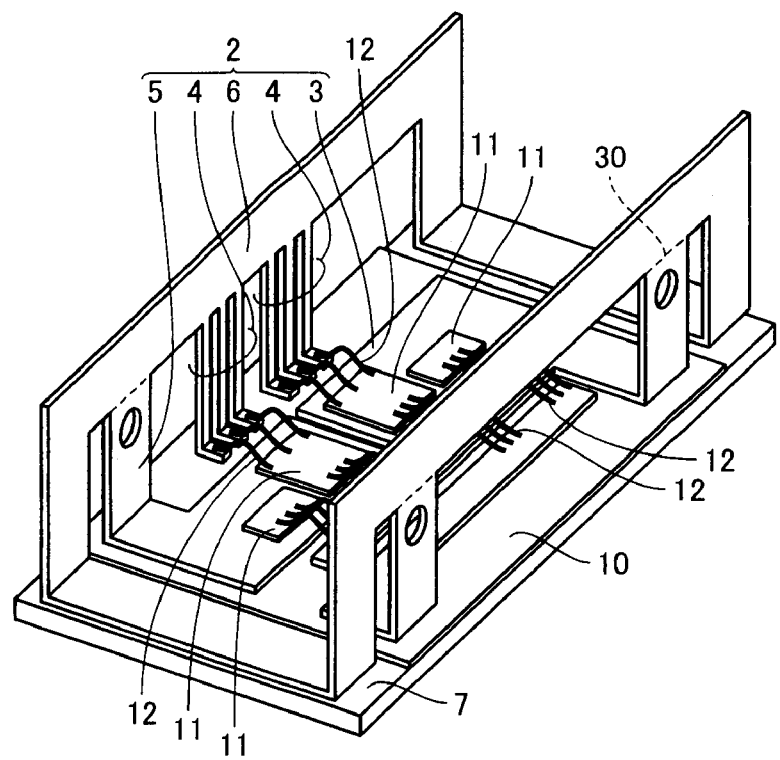
FIG. 7 is a perspective view showing a step performed after the steps shown in FIGS. 4 to 6 of Embodiment 1.
Figure 8:
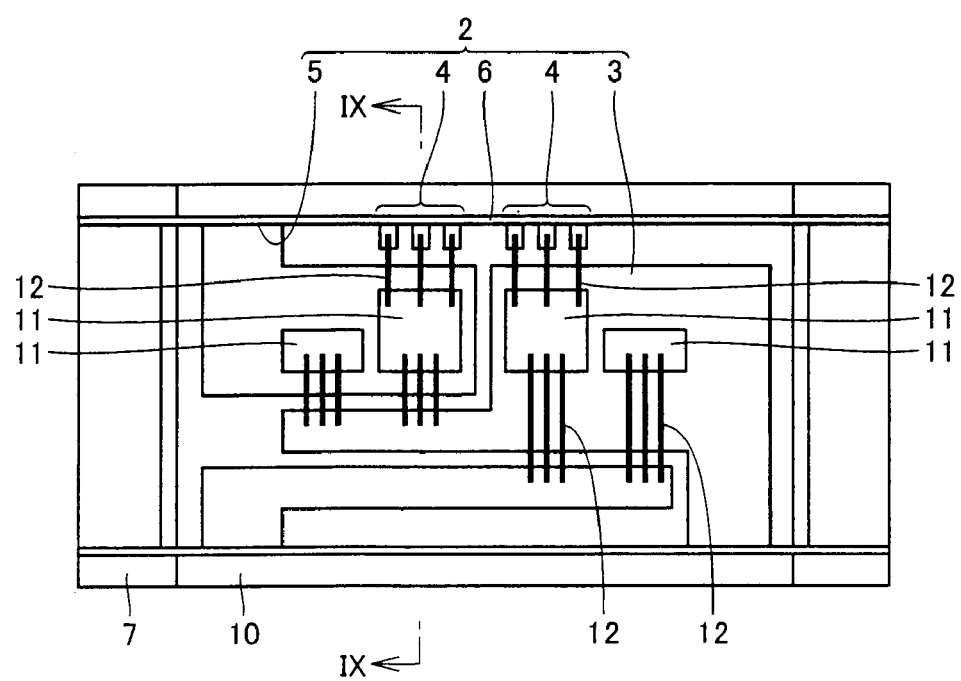
FIG. 8 is a plan view of the step shown in FIG. 7 of Embodiment 1.
Figure 9:
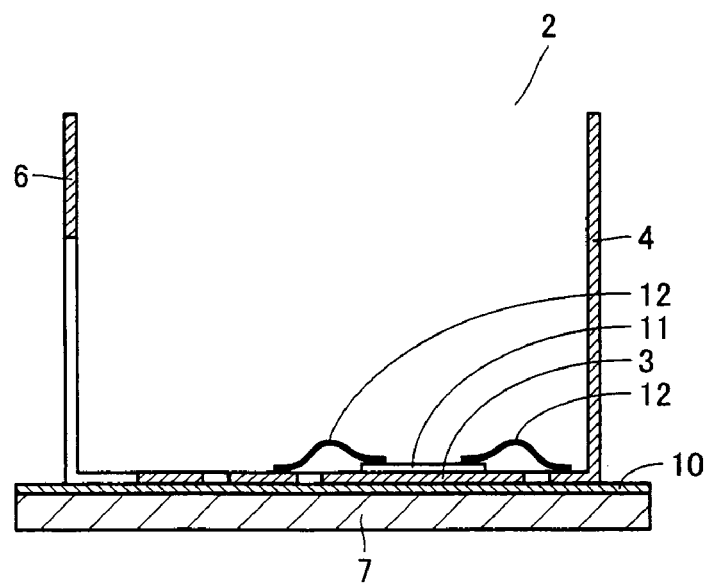
FIG. 9 is a cross-sectional view taken along the line IX-IX shown in FIG. 8 of Embodiment 1.
Figure 10:
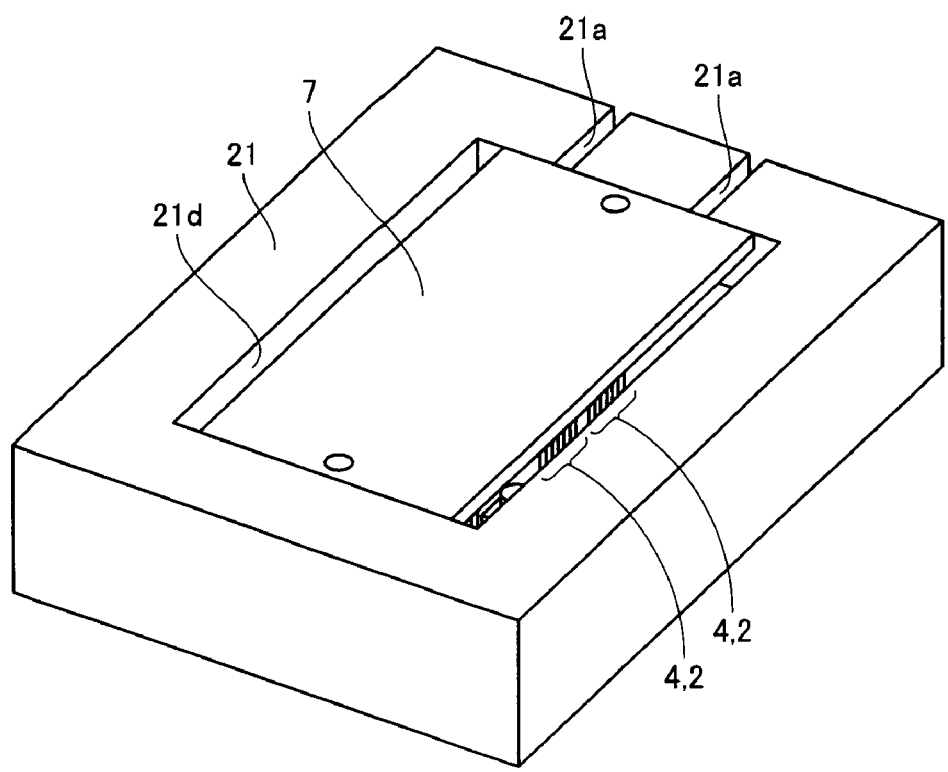
FIG. 10 is a perspective view showing a step performed after the steps shown in FIGS. 7 to 9 of Embodiment 1.
Figure 11:
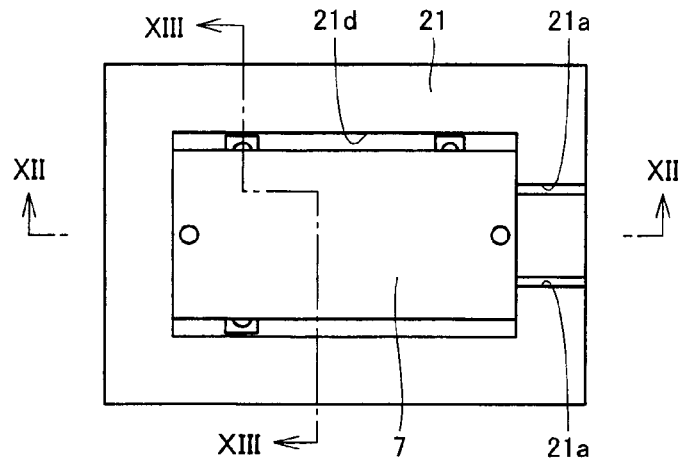
FIG. 11 is a plan view of the step shown in FIG. 10 of Embodiment 1.
Figure 12:
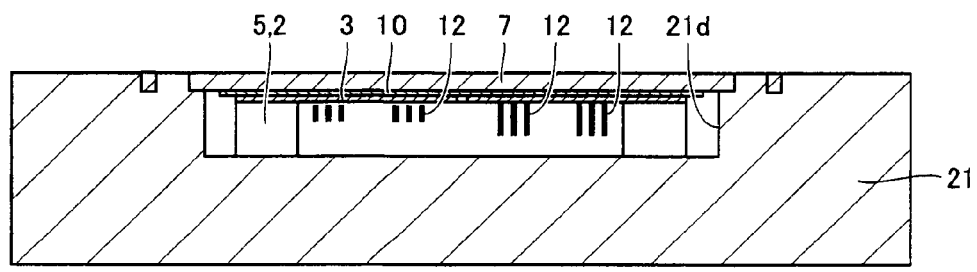
FIG. 12 is a cross-sectional view taken along the line XII-XII shown in FIG. 11 of Embodiment 1.
Figure 13:
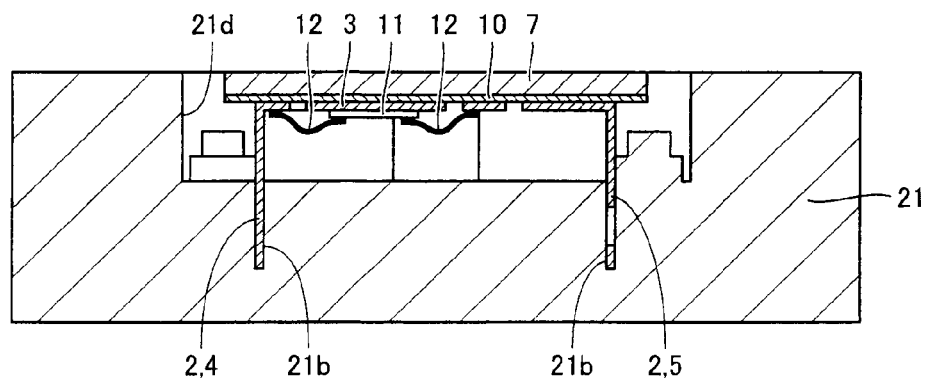
FIG. 13 is a cross-sectional view taken along the line XIII-XIII shown in FIG. 11 of Embodiment 1.
Figure 14:
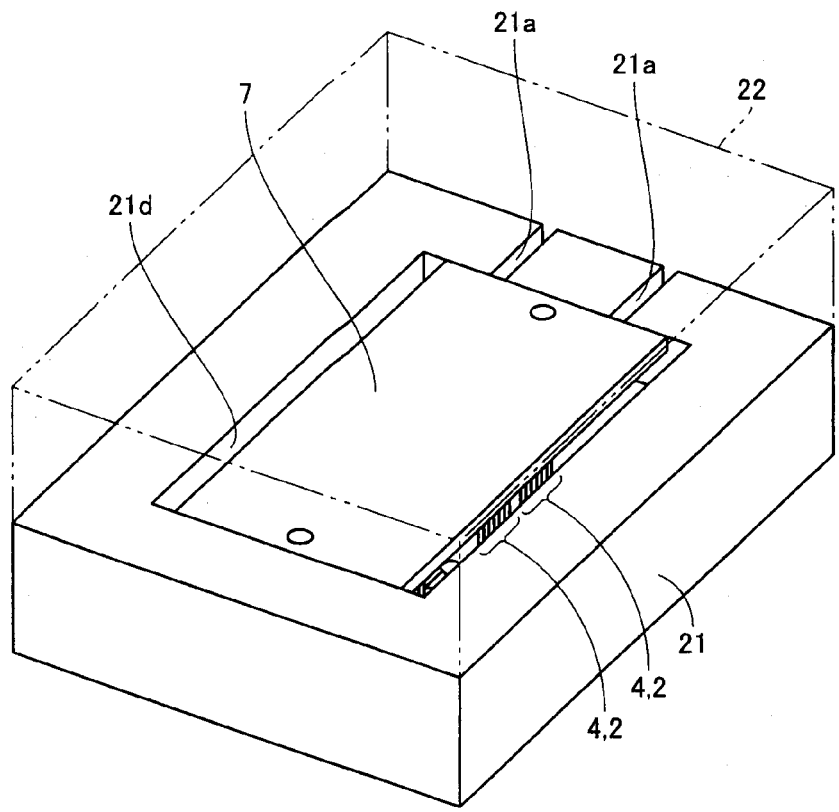
FIG. 14 is a perspective view showing a step performed after the steps shown in FIGS. 10 to 13 of Embodiment 1.
Figure 15:
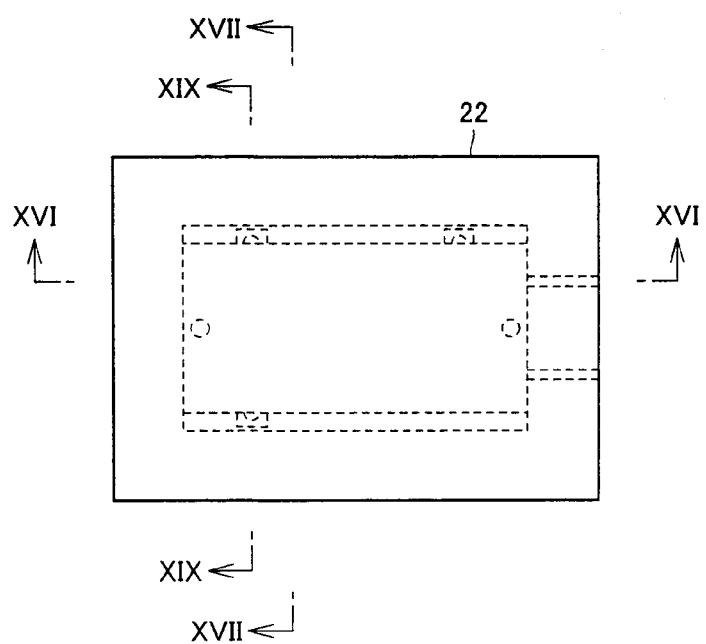
FIG. 15 is a plan view of the step shown in FIG. 14 of Embodiment 1.
Figure 16:
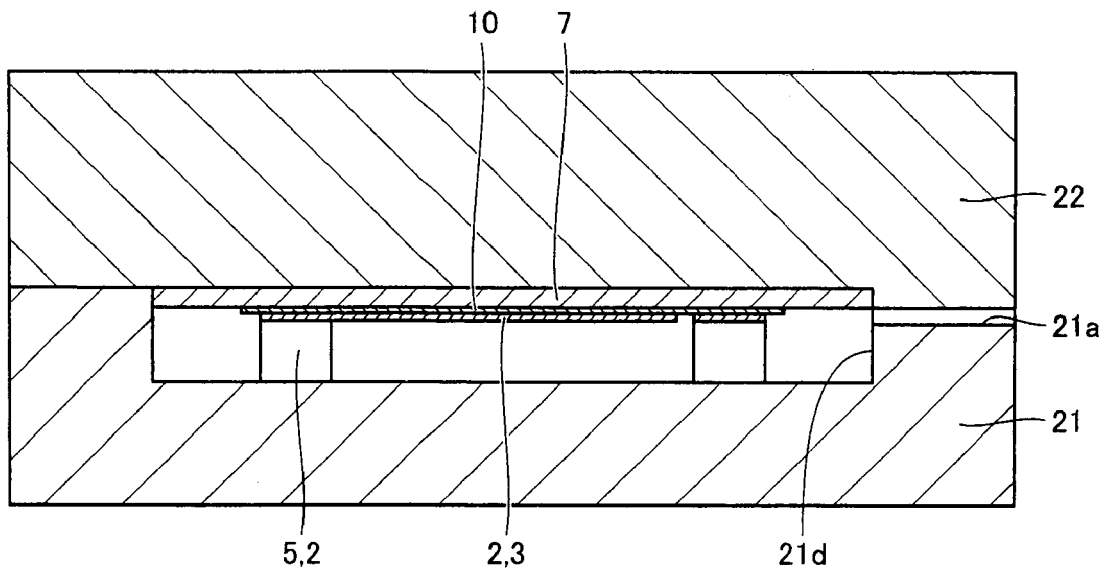
FIG. 16 is a cross-sectional view taken along the line XVI-XVI shown in FIG. 15 of Embodiment 1.
Figure 17:
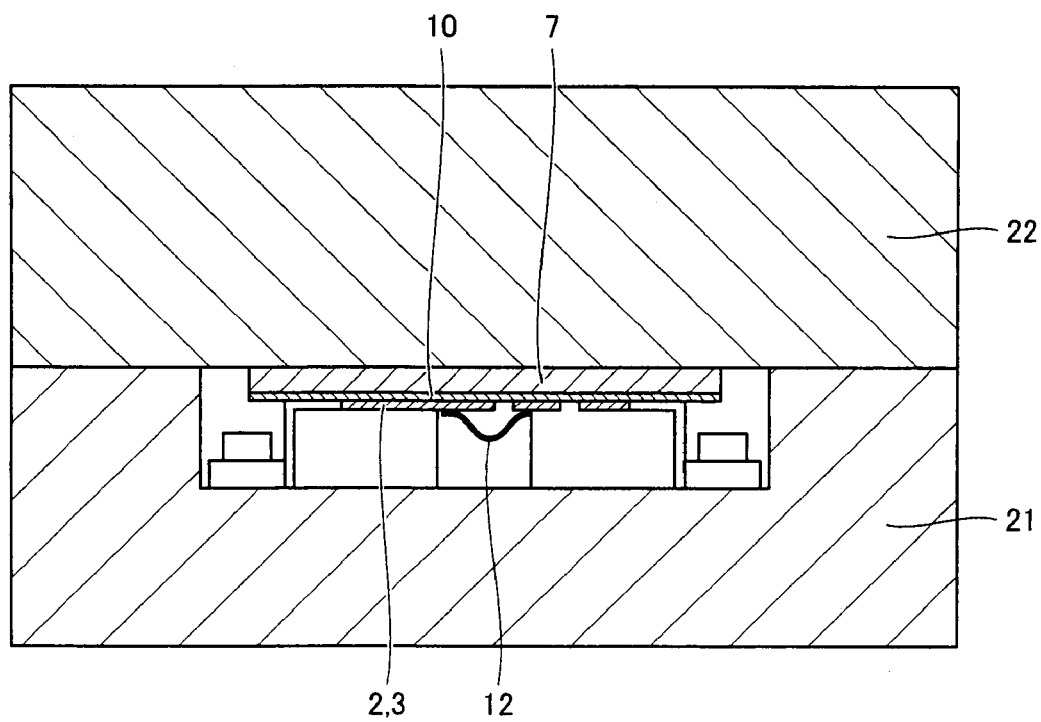
FIG. 17 is a cross-sectional view taken along the line XVII-XVII shown in FIG. 15 of Embodiment 1.

Next, as shown in FIGS. 4, 5 and 6, the portion of frame body 3 of lead frame 2 is fixed on a surface of a heat-radiating plate 7 formed, for example, of copper (Cu), with a resin sheet 10 having high thermal conductivity interposed. Next, as shown in FIGS. 7, 8 and 9, a semiconductor chip 11 such as an IGBT or a diode is adhered with solder (not shown) at a prescribed position of frame body 3 (die-bonding). Next, a prescribed electrode of die-bonded semiconductor chip 11 and a corresponding lead terminal 4 or the like are electrically connected by a prescribed wire, for example, of aluminum (wire-bonding).

Thereafter, tie bar 6 is removed by cutting a prescribed portion (dotted line 30) of lead frame 2. As to the order of bending the lead frame, die-bonding and wire-bonding the semiconductor chip, it is a general method of die-bonding the semiconductor chip to the frame body before bending the lead frame, and then performing wire-bonding. In the method described above, it is necessary to fix the lead frame to the heat-radiating plate with a resin sheet of high thermal conductivity interposed, and therefore, first, the lead frame is bent, and then the semiconductor chip is die-bonded on the frame body, followed by wire-bonding.

Next, an operation of sealing semiconductor chip 11 wire-bonded to lead terminal 4 and the like in this manner with a prescribed resin is performed. First, as shown in FIGS. 10, 11, 12 and 13, lead frame 2 with semiconductor chip 11 mounted is set in a recessed portion 21d of a first metal mold 21, with a rear surface of heat-radiating plate 7 facing upward. Specifically, lead frame 2 is set in such a manner that semiconductor chip 11 is covered with resin from above, or from the side on which semiconductor chip 11 is mounted. First metal mold 21 has a gate 21a formed therein, for feeding resin to the recessed portion 21d. Tip end portion of each lead terminal 4 and tip end portion of main electrode terminal 5 are inserted to reception openings 21b provided in first metal mold 21.

Figure 18:
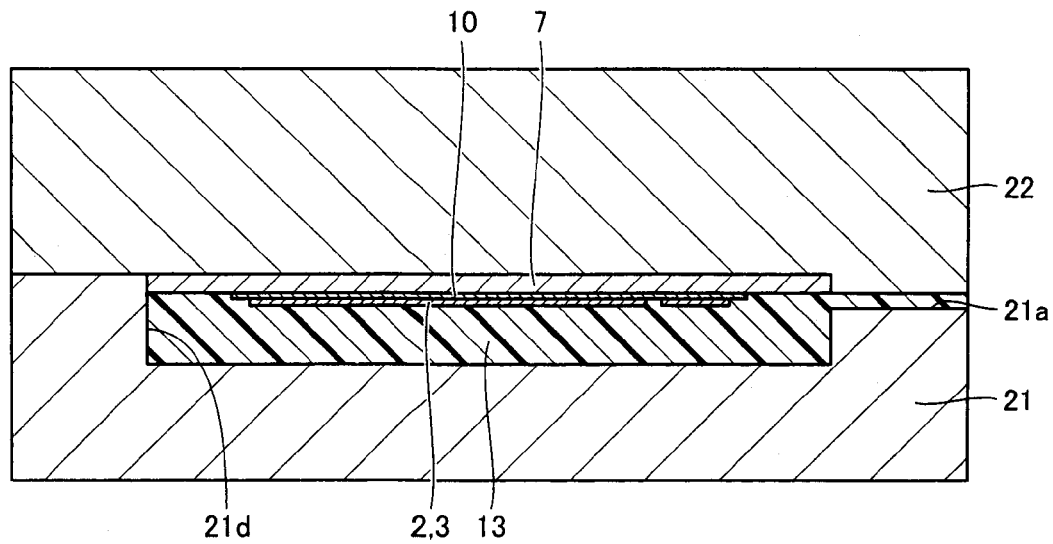
FIG. 18 is a cross sectional view corresponding to the line XVI-XVI of FIG. 15, showing a step performed after the steps of FIGS. 14 to 17 of Embodiment 1.
Figure 19:
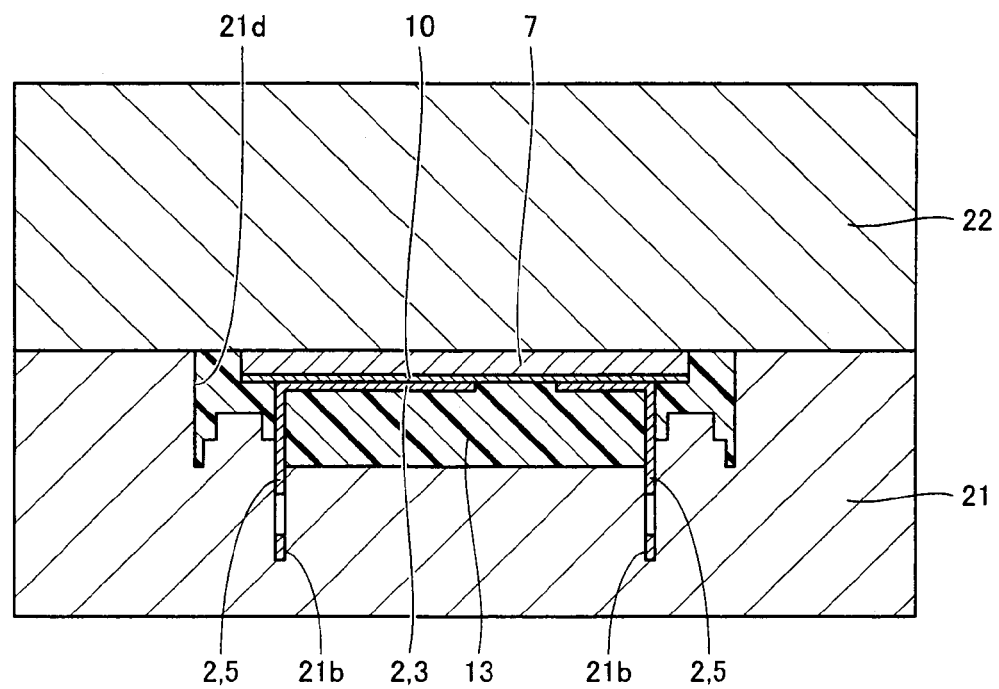
FIG. 19 is a cross sectional view corresponding to the line XIX-XIX of FIG. 15 showing the step of FIG. 18 of Embodiment 1.

Next, as shown in FIGS. 14, 15, 16 and 17, a second metal mold 22 is mounted on the first metal mold 21 such that lead frame 2 set in recessed portion 21d of first metal mold 21 is enclosed in recessed portion 21d. Next, as shown in FIGS. 18 and 19, resin 13 is introduced through gate 21a, and recessed portion 21d containing frame body 3 and the like therein is filled with resin 13. By way of example, a thermoplastic resin such as PPS (Poly Phenylene Sulfide) is used as the resin.

Figure 20:
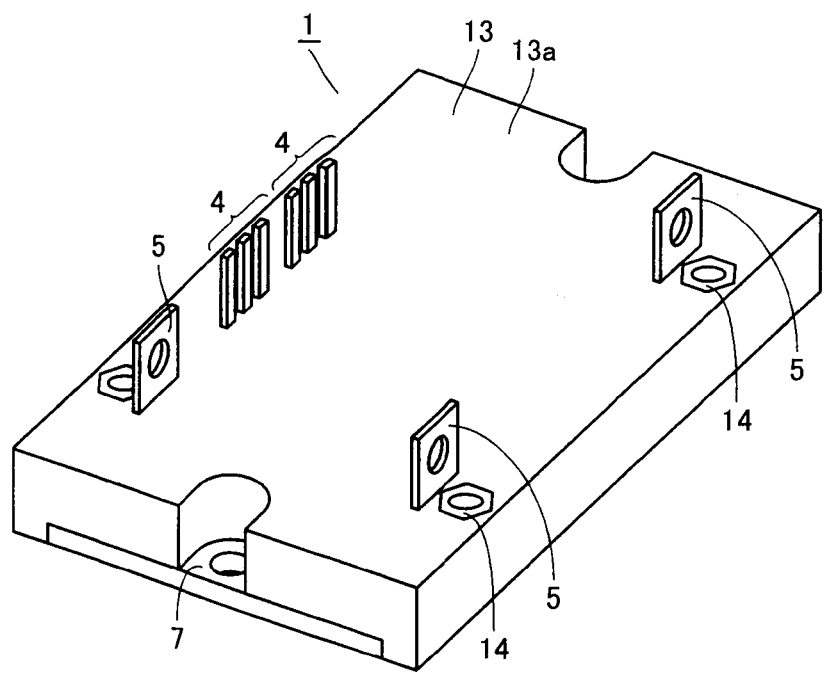
FIG. 20 is a perspective view showing a step performed after the steps of FIGS. 18 and 19 of Embodiment 1.

After the resin 13 is cured, second metal mold 22 is separated from first metal mold 21. Thus, a semiconductor device having semiconductor chip 11 and frame body 3 and the like (see FIG. 7) sealed with resin 13 as shown in FIG. 20 is taken out. From a surface 13a of resin 13 corresponding to the upper surface of the semiconductor device, that is, the surface 13a of resin 13 of that portion which covers semiconductor chip 11 from above, tip portions of lead terminal 4 and main electrode terminal 5 are exposed. Further, on the surface 13a of resin 13, a nut 14 for fixing a bus bar (not shown) or the like with a bolt is provided.

Figure 21:
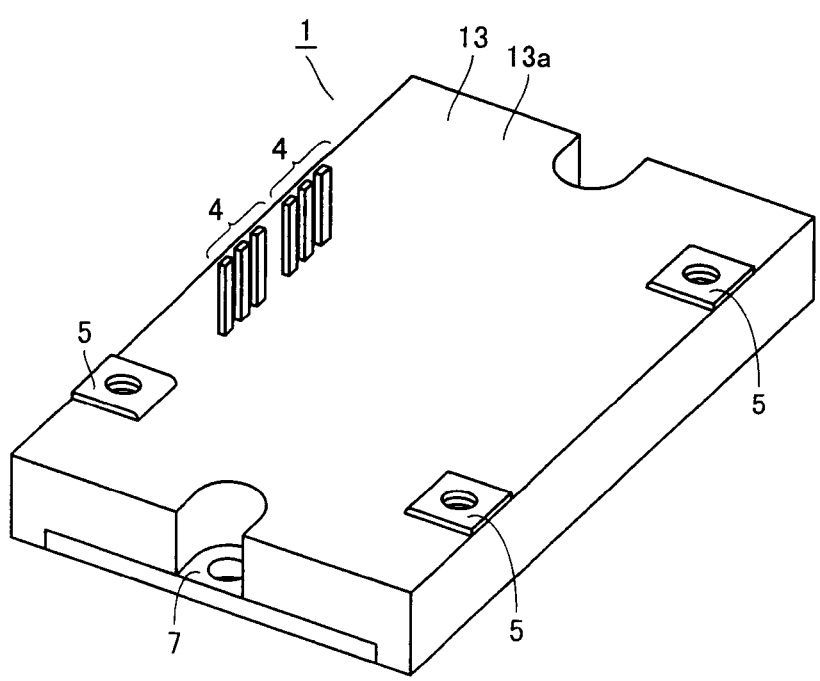
FIG. 21 is a perspective view showing a step performed after the step of FIG. 20 of Embodiment 1.
Figure 22:
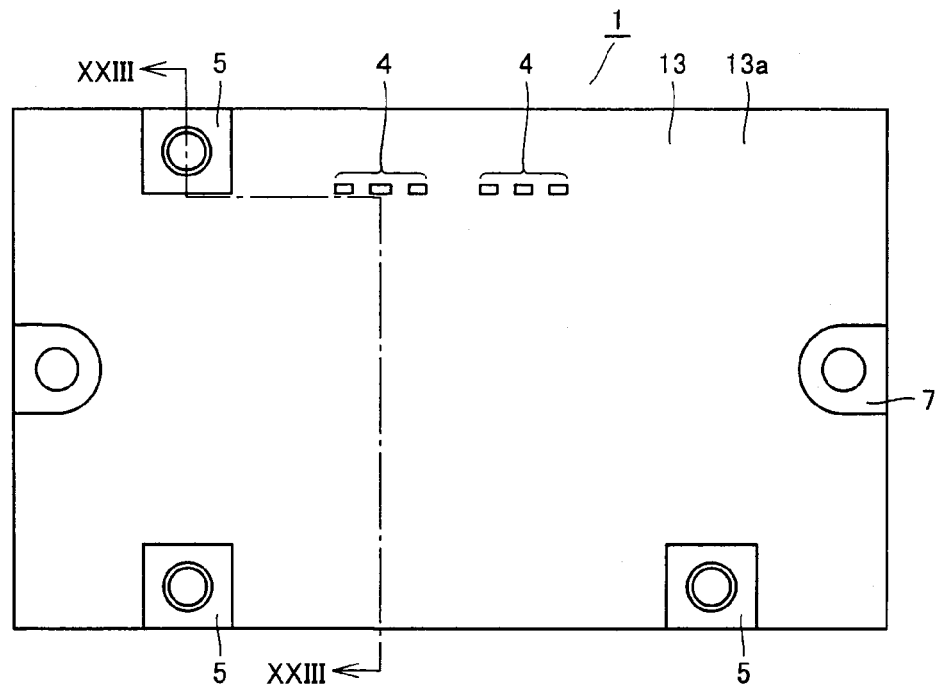
FIG. 22 is a plan view of the step shown in FIG. 21 of Embodiment 1.
Figure 23:
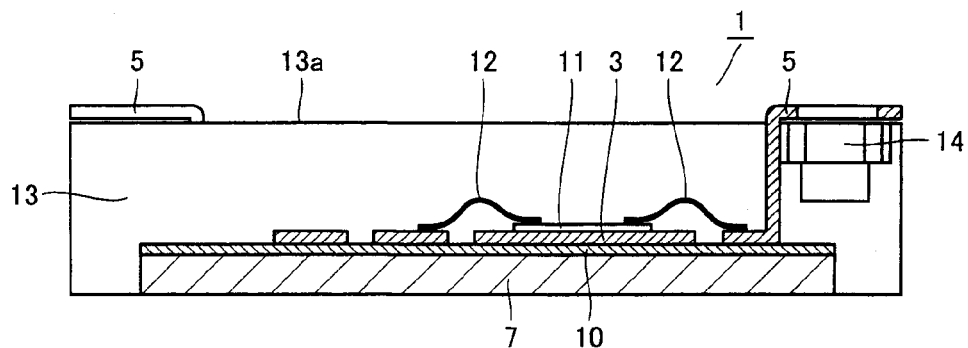
FIG. 23 is a cross-sectional view taken along the line XXIII-XXIII shown in FIG. 22 of Embodiment 1.

Next, as shown in FIGS. 21, 22 and 23, tip end portion of main electrode terminal 5 is bent to be parallel to the upper surface of resin 13. Thus, semiconductor device 1 is finished. In finished semiconductor device 1, main electrode terminal 5 and lead terminal 4 are exposed at surface 13a of resin 13, and lead terminal and the like are not exposed on any side surface. At the rear surface of resin 13, a surface (lower surface) of heat-radiating plate 7 is exposed. Thus, lead frame 2 (frame body 3) and semiconductor chip 11 as a whole mounted on the upper surface of heat-radiating plate 7 are covered with resin 13 from above, and sealed with resin 13.

According to the method of manufacturing semiconductor device 1 described above, main electrode terminal 5 and lead terminal 4 are not exposed at the side surface of resin 13, and exposed at upper surface 13a of resin 13 opposite to heat-radiating plate 7. If lead terminal 4 and the like are protruded and exposed at the side surface of resin 13, it would be necessary to ensure sufficient distance between the exposed portion of lead terminal 4 and the like and the exposed portion (lower surface) of heat-radiating plate 7 formed of metal, in order to prevent creeping discharge between these portions. Therefore, in that case, resin 13 must have a prescribed thickness.

If lead terminal 4 and the like are protruded and exposed at the upper surface of resin 13, the portions where lead terminal 4 and the like are protruded are spaced by a distance from the upper end of the side surface of resin 13. Therefore, by that distance, the thickness of resin 13 can be reduced, which contributes to reduction in size of semiconductor device 1.

Modification

Figure 24:
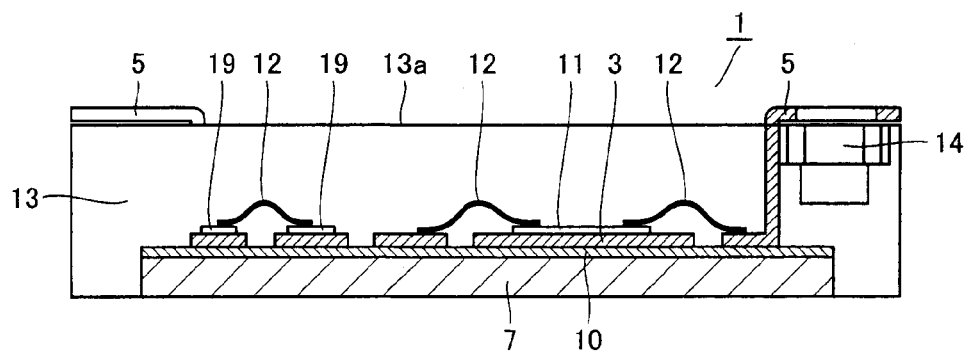
FIG. 24 is a cross-sectional view corresponding to the line XXIII-XXIII shown in FIG. 22, of a semiconductor device of a modification of Embodiment 1.

In semiconductor device 1 described above, semiconductor chip 11 such as an IGBT or a diode has been described as an exemplary semiconductor chip to be mounted on frame body 3 of lead frame 2. Specifically, only power semiconductors are described as examples. As semiconductor device 1 as shown in FIG. 24, together with semiconductor chip 11 such as the IGBT or diode, a control circuit chip 19 having a control circuit for controlling an operation of semiconductor device 1 formed thereon, may be mounted. When the control circuit (IC (Integrated Circuit)) chip 19 is sealed with resin, control circuit chip 19 is protected, and hence, reliability of driving semiconductor device 1 can be improved.

Figure 25:
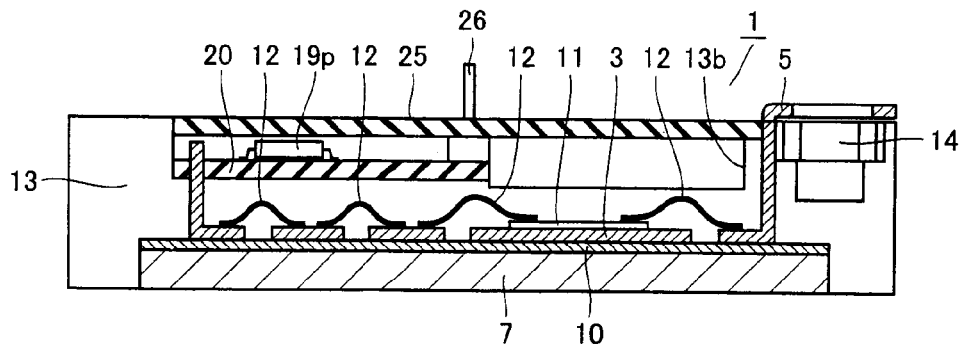
FIG. 25 is a cross-sectional view corresponding to the line XXIII-XXIII shown in FIG. 22, of a semiconductor device of another modification of Embodiment 1.

Further, in place of sealing control circuit (IC) chip 19 with resin 13 as shown in FIG. 24, after sealing semiconductor chip 11 such as the IGBT or diode with resin 13, a printed board 20 having an interconnection pattern allowing electrical connection with lead terminal 4 may be arranged at a prescribed position of an upper surface of resin 13 such as a portion where a recessed portion 13b is formed, and on printed board 20, a packaged control circuit (IC) 19p or other electronic component may be mounted as shown in FIG. 25.

A lead terminal (pin) 26 for external connection, allowing signal input/output to/from control circuit (IC) 19p or the like may be provided on printed board 20, and for protection of printed board 20 or the like, printed board 20 or the like may be covered with a lid 25 or with resin (not shown). By adopting such a structure, it becomes possible to mount a control circuit structure and the like including a number of electronic components on one semiconductor device.

Embodiment 2

Figure 26:
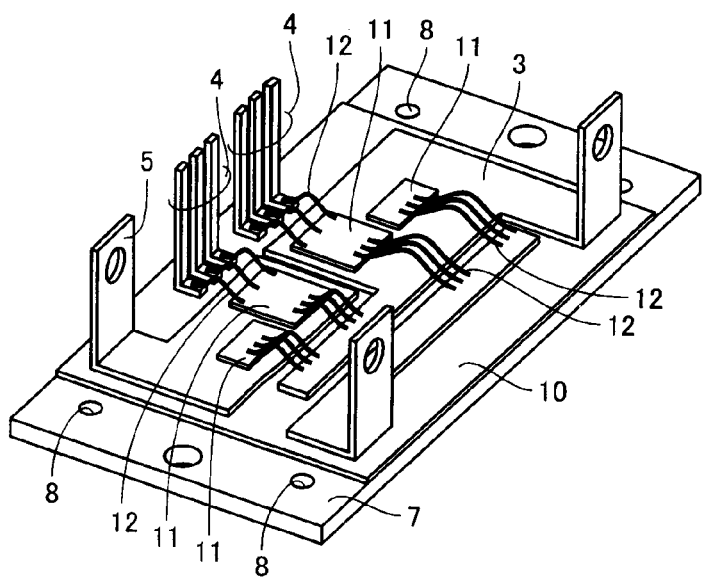
FIG. 26 is a perspective view showing a step of manufacturing a semiconductor device in accordance with Embodiment 2 of the present invention.
Figure 27:
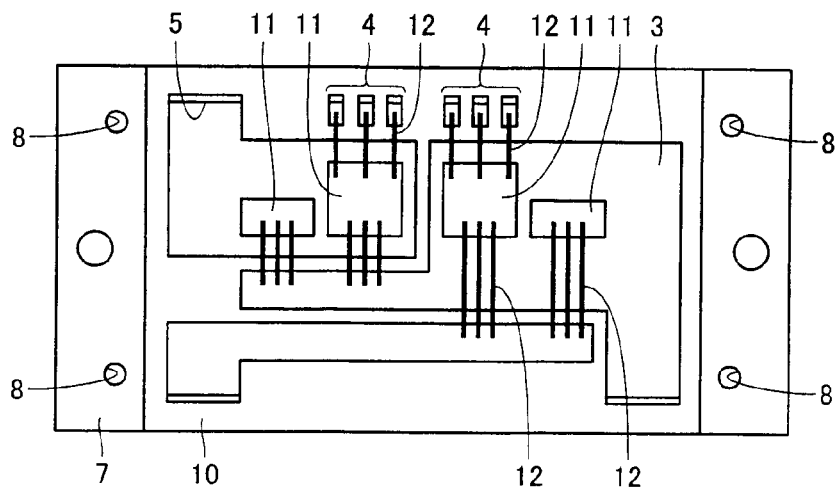
FIG. 27 is a plan view of the step shown in FIG. 26 of Embodiment 2.

Here, a method of manufacturing a semiconductor device that improves adhesion between the heat-radiating plate and the resin will be described. As shown in FIGS. 26 and 27, as a heat-radiating plate, heat-radiating plate 7 having openings 8 formed at opposite ends along the longitudinal direction is prepared. Then, through the similar method as described above, semiconductor chip 11 of IGBT or diode is adhered (die-bonded) to frame body 3. Next, a prescribed electrode of the die-bonded semiconductor chip 11 and a corresponding lead terminal 4 or the like are electrically connected by a wire. Then, the tie bar portion is cut.

Figure 28:
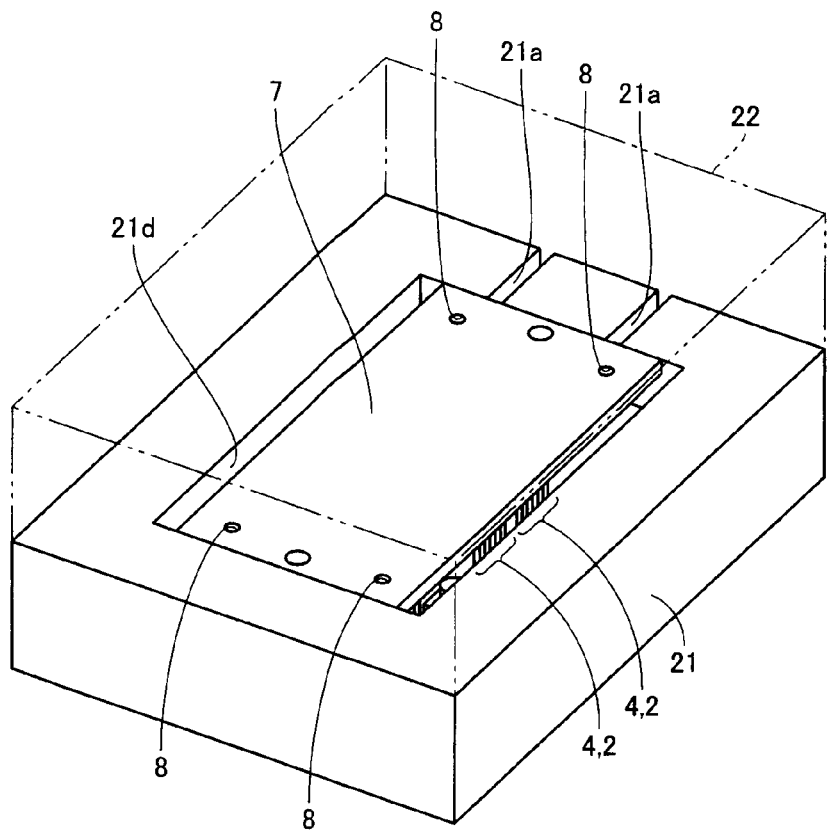
FIG. 28 is a perspective view showing a step performed after the steps of FIGS. 26 and 27 of Embodiment 2.

Next, as shown in FIG. 28, lead frame 2 having semiconductor chip 11 mounted thereon is set with the rear surface of heat-radiating plate 7 facing upward, in recessed portion 21d of first metal mold 21. A second metal mold 22 is mounted on the first metal mold 21 such that lead frame 2 set in recessed portion 21d of first metal mold 21 is enclosed in recessed portion 21d. Next, resin 13 is introduced through gate 21a, and recessed portion 21d containing frame body 3 and the like therein is filled with thermoplastic resin 13 (see, for example, FIG. 18).

Figure 29:
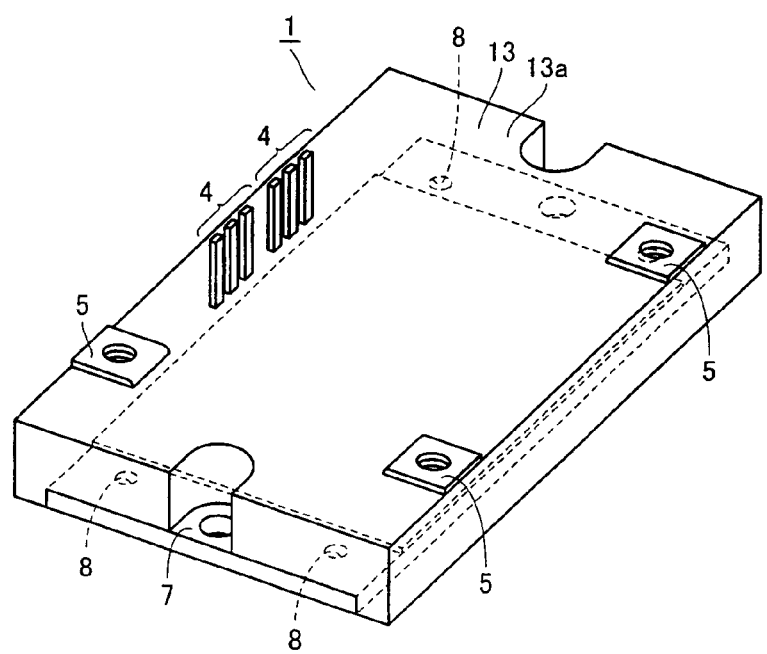
FIG. 29 is a perspective view showing a step performed after the step of FIG. 28 of Embodiment 2.

After the resin 13 is cured, second metal mold 22 is separated from first metal mold 21. Thus, a semiconductor device having semiconductor chip 11 and frame body 3 and the like sealed with resin 13 is taken out. Next, as shown in FIG. 29, main electrode terminal 5 is bent to be parallel to the upper surface 13a of resin 13. Thus, semiconductor device 1 is finished.

In semiconductor 1, in addition to the effects attained by semiconductor device 1 described above, the following effects are attained. Specifically, heat-radiating plate 7 is provided with openings 8, and resin 13 enters the openings 8 at the time of sealing with resin 13. Thus, adhesion between resin 13 and heat-radiating plate 7 can be improved. Consequently, moisture resistance of semiconductor device 1 can be improved, and hence, reliability can further be improved.

Modification

Figure 30:
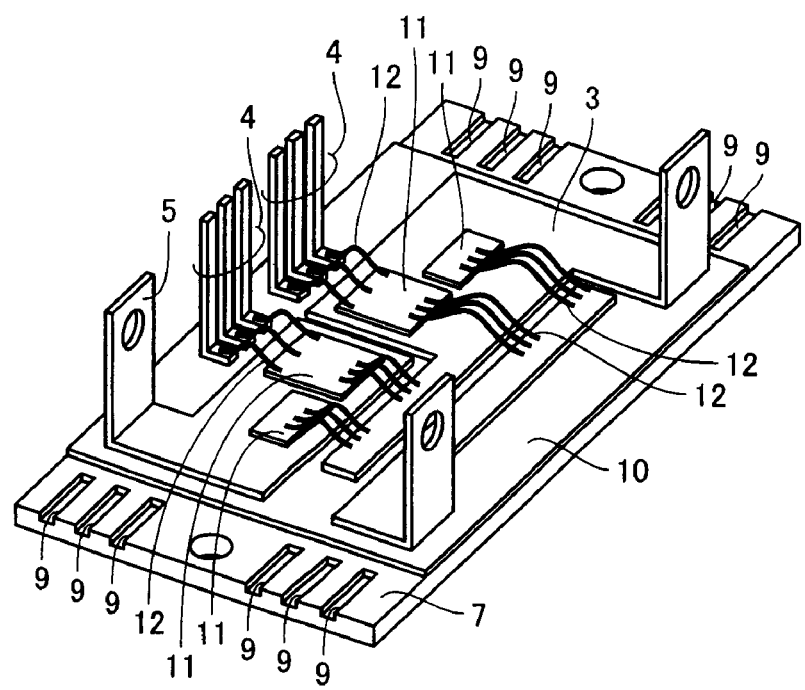
FIG. 30 is a perspective view showing a method of manufacturing a semiconductor device in accordance with a modification of Embodiment 2.
Figure 31:
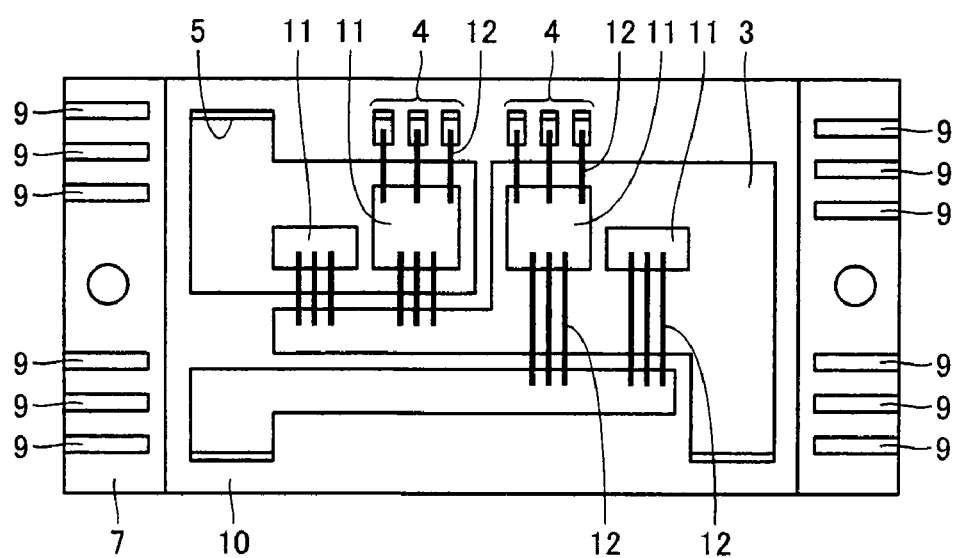
FIG. 31 is a plan view of the step shown in FIG. 30 of Embodiment 2.

In semiconductor device 1 above, heat-radiating plate 7 having an openings formed at prescribed positions has been described as an example. As heat-radiating plate 7, one having a trench may be used, besides the openings 8. Here, as shown in FIGS. 30 and 31, a heat-radiating plate 7 having trenches 9 formed at opposite ends along the longitudinal direction is prepared. Trenches 9 extend along the direction of introducing the resin.

Figure 32:
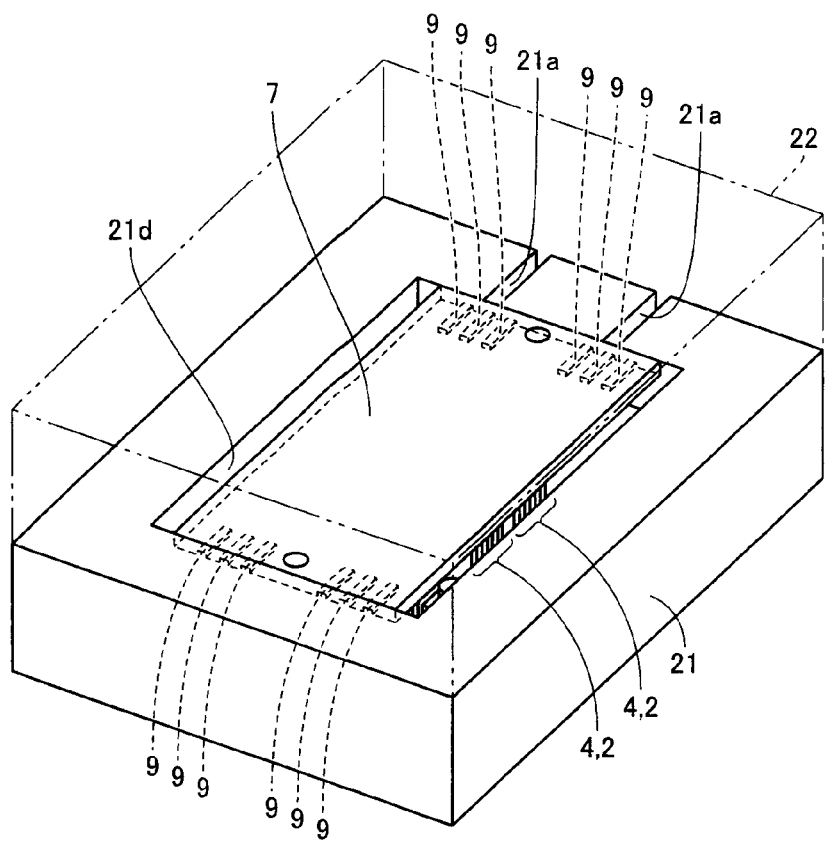
FIG. 32 is a perspective view showing a step performed after the steps shown in FIGS. 30 and 31 of Embodiment 2.

Lead frame 2 and semiconductor chip 11 are mounted on heat-radiating plate 7, thereafter, as shown in FIG. 32, lead frame 2 is set in recessed portion 21d of first metal mold 21, and second metal mold 22 is mounted on the first metal mold 21.

Figure 33:
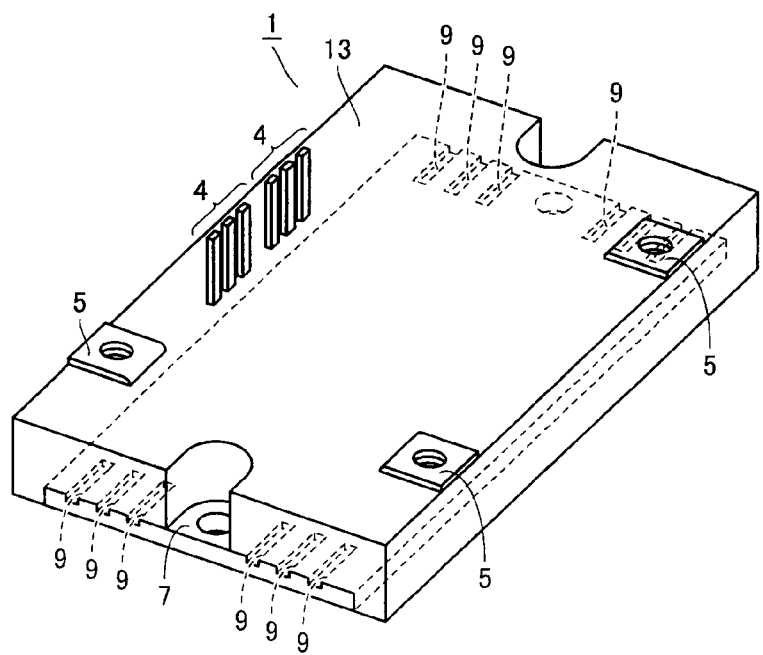
FIG. 33 is a perspective view showing a step performed after the step shown in FIG. 32 of Embodiment 2.

Thereafter, resin 13 (see, for example, FIG. 18) is introduced through gate 21a, and recessed portion 21d containing frame body 3 and the like therein is filled with thermoplastic resin 13. Here, as resin 13 is introduced, trenches 9 formed along the direction of introduction are surely filled with resin. After the resin 13 is cured, second metal mold 22 is separated from the first metal mold 21, and the semiconductor device having semiconductor chip 11, frame body 3 and the like sealed with resin 13 is taken out. Thereafter, main electrode terminal 5 is bent to be parallel to the upper surface 13a of resin 13 as shown in FIG. 33, and semiconductor device 1 is finished.

In semiconductor device 1, trenches 9 are formed in heat-radiating plate 7 along the direction of introducing resin 13. Therefore, the trenches can more reliably be filled with resin 13 when the resin is introduced, and hence, adhesion between resin 13 and heat-radiating plate 7 can be improved as in the case of openings 8.

Figure 34:
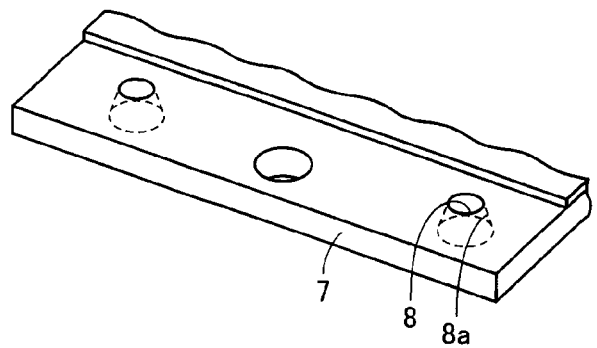
FIG. 34 is a partially enlarged perspective view showing a heat-radiating plate of the semiconductor device in accordance with another modification of Embodiment 2.
Figure 35:
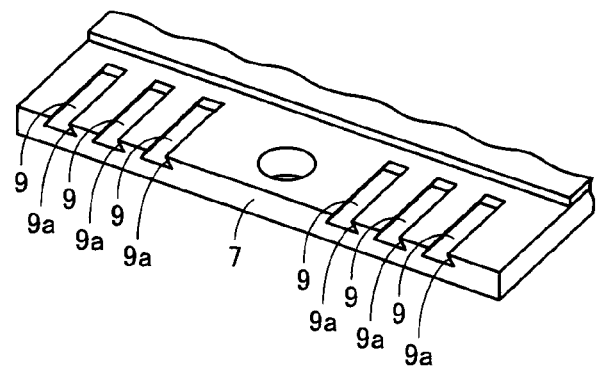
FIG. 35 is a partially enlarged perspective view showing a heat-radiating plate of the semiconductor device in accordance with a further modification of Embodiment 2.

As to the opening, an opening with a taper 8a of which cross-sectional area is increased gradually from the front surface side to the rear surface side of heat-radiating plate 7, such as shown in FIG. 34, may be used. As to the trench, a trench 9 with a similar taper 9a, such as shown in FIG. 35, may be used. When opening 8 or trench 9 with such taper 8a or 9a is used, adhesion between resin 13 and heat-radiating plate 7 can further be improved, as the cured resin 13 is caught by taper 8a or 9a.

Embodiment 3

Figure 36:
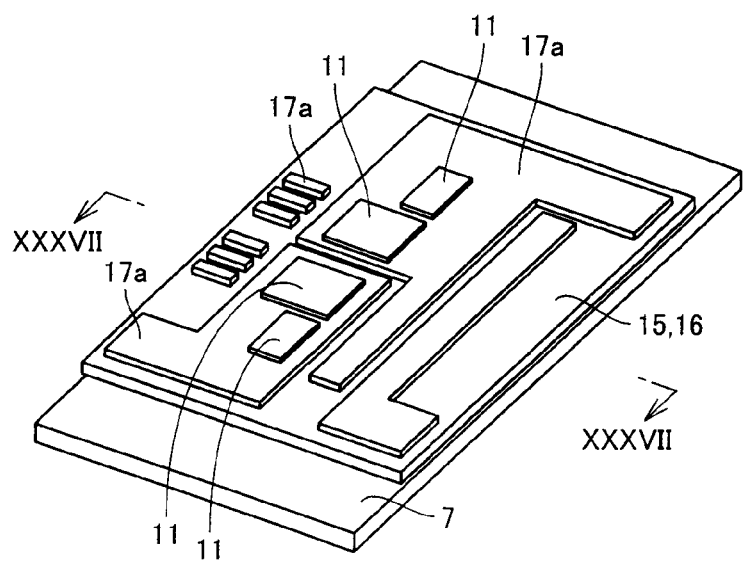
FIG. 36 is a perspective view showing a step of manufacturing a semiconductor device in accordance with Embodiment 3 of the present invention.
Figure 37:
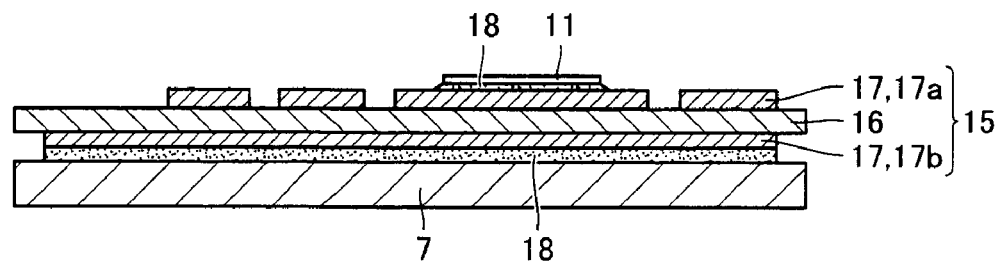
FIG. 37 is a cross-sectional view taken along the line XXXVII-XXXVII shown in FIG. 36 of Embodiment 3.

Here, a semiconductor device having a ceramic substrate as the element-mounting member will be described. First, as shown in FIGS. 36 and 37, a ceramic substrate 15 as an element-mounting member is prepared. Ceramic substrate 15 includes a ceramic substrate body 16 and a prescribed copper pattern 17. The prescribed copper pattern 17 is formed both on a front surface and a rear surface of ceramic substrate body 16.

As to copper pattern 17, on the surface of ceramic substrate body 16 on which the semiconductor chip is to be mounted (front surface), a copper pattern 17a corresponding to arrangements of the semiconductor chip, lead terminal and the like is formed. On a prescribed position of copper pattern 17a, semiconductor chip 11 is mounted (die-bonded) using solder 18. On a rear surface of ceramic substrate body 16, a copper pattern 17b is formed, and fixed by solder 18 to a surface of heat-radiating plate 7.

Figure 38:
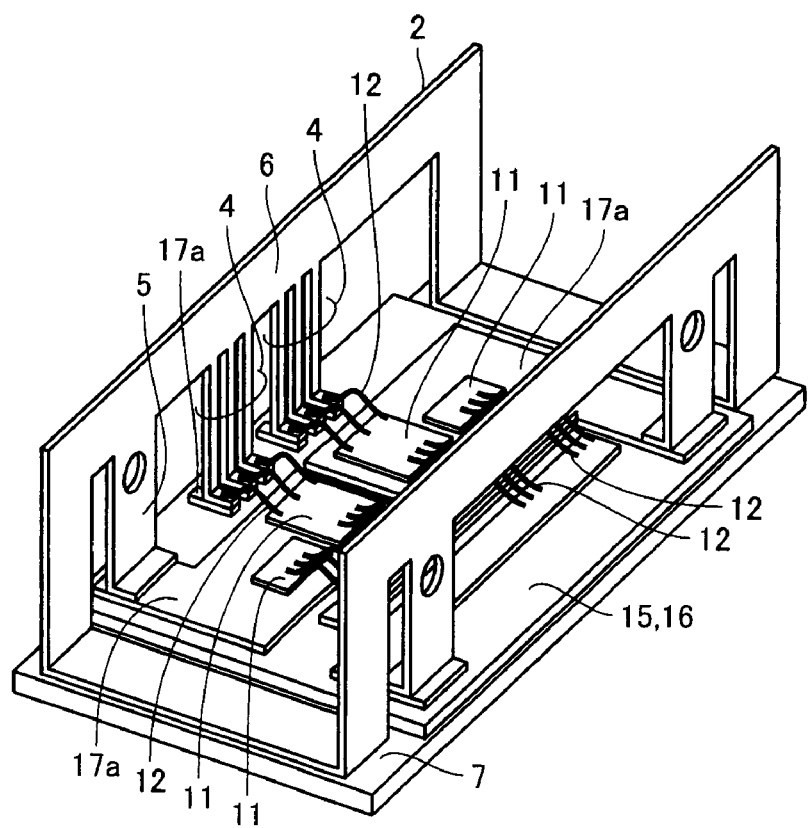
FIG. 38 is a perspective view showing a step performed after the steps shown in FIGS. 36 and 37 of Embodiment 3.
Figure 39:
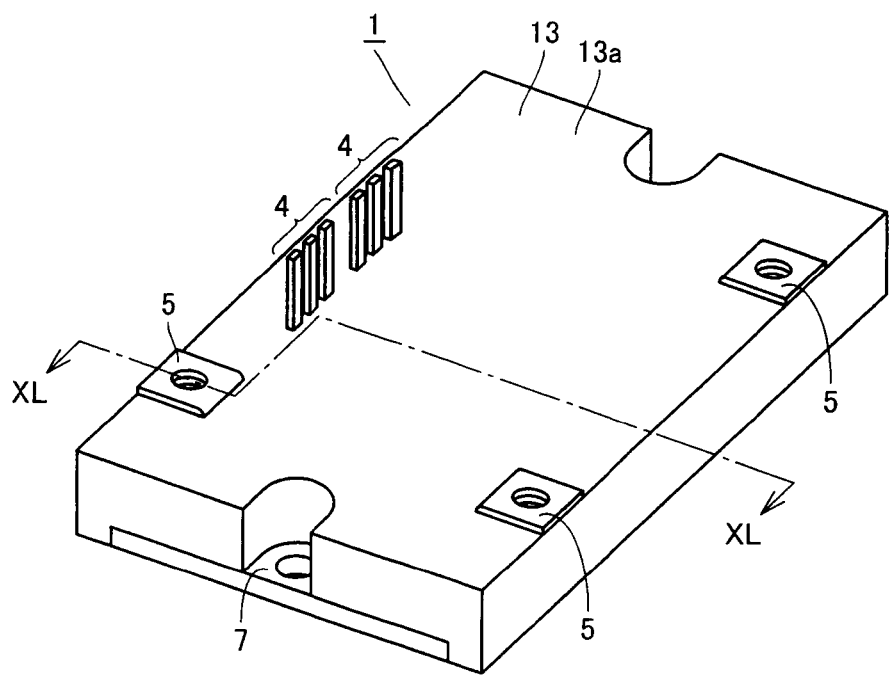
FIG. 39 is a perspective view showing a step performed after the step shown in FIG. 38 of Embodiment 3.
Figure 40:
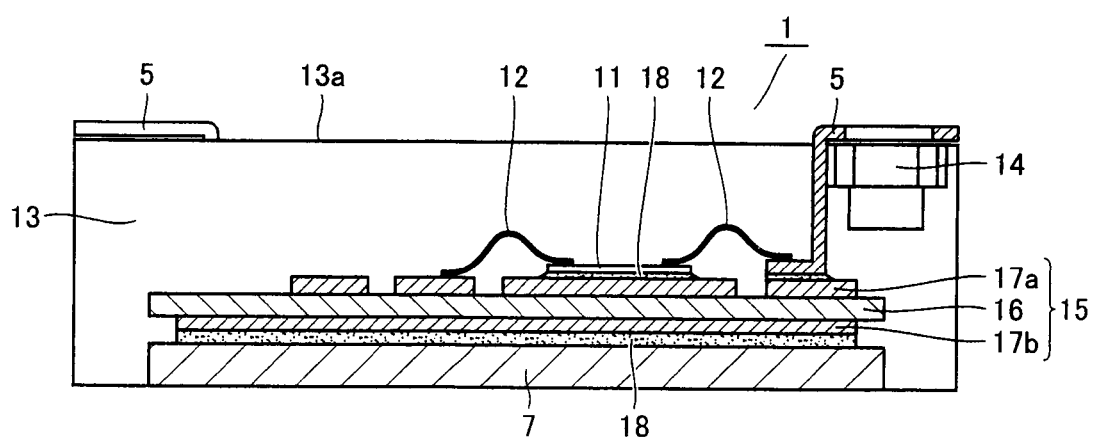
FIG. 40 is a cross-sectional view taken along the line XL-XL shown in FIG. 39 of Embodiment 3.

Next, as shown in FIG. 38, lead frame 2 is attached such that lead terminal 4 and main electrode terminal 5 are connected to the corresponding copper pattern 17a. Lead terminal 4 and main electrode terminal 5 are connected by solder to the corresponding copper pattern 17a. Thereafter, through the steps similar to those shown in FIGS. 10 to 19, semiconductor device 1 having semiconductor chip 11 and ceramic substrate 15 sealed with resin 13 is formed, as shown in FIGS. 39 and 40.

According to the method of manufacturing semiconductor device 1 described above, semiconductor chip 11 and the like are sealed with thermoplastic resin 13, and therefore, as compared with the conventional semiconductor device formed using an insert case, the insert case, which is expensive, becomes unnecessary. Thus, manufacturing cost of semiconductor device 1 can be reduced.

Further, in semiconductor device 1 formed in this manner, main electrode terminal 5 and lead terminal 4 are exposed only at the upper surface 13a of resin 13 opposite to heat-radiating plate 7. Accordingly, thickness of resin 13 can be reduced as described above, which contributes to reduction in size of semiconductor device 1. Further, as the ceramic substrate is used, semiconductor device 1 comes to have good heat-radiating property.

Modification

Figure 41:
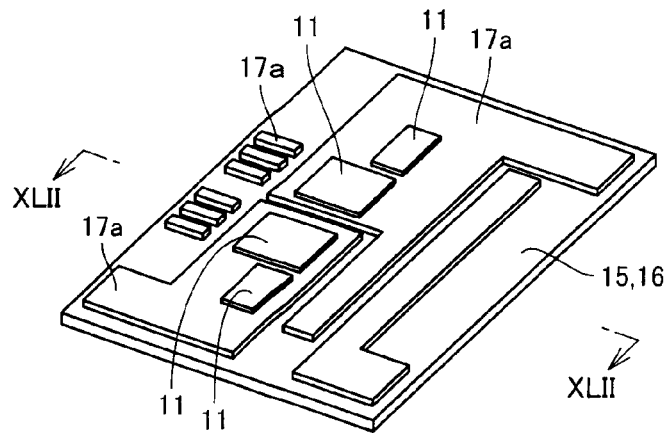
FIG. 41 is a perspective view showing a step of manufacturing a semiconductor device in accordance with a modification of Embodiment 3.
Figure 42:
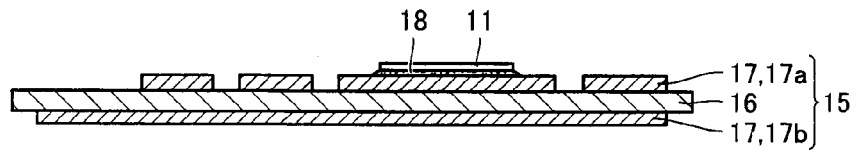
FIG. 42 is a cross-sectional view taken along the line XLII-XLII shown in FIG. 41 of Embodiment 3.

In the foregoing, a semiconductor device having a ceramic substrate fixed on a heat-radiating plate has been described as an example. The device may not include a heat-radiating plate. In that case, first, as shown in FIGS. 41 and 42, on a prescribed position of copper pattern 17a formed on a surface of ceramic substrate body 16, semiconductor chip 11 is mounted (die-bonded) using solder 18. On copper pattern 17b on the rear surface of ceramic substrate 16, no heat-radiating plate is fixed, and copper pattern 17b is exposed.

Figure 43:
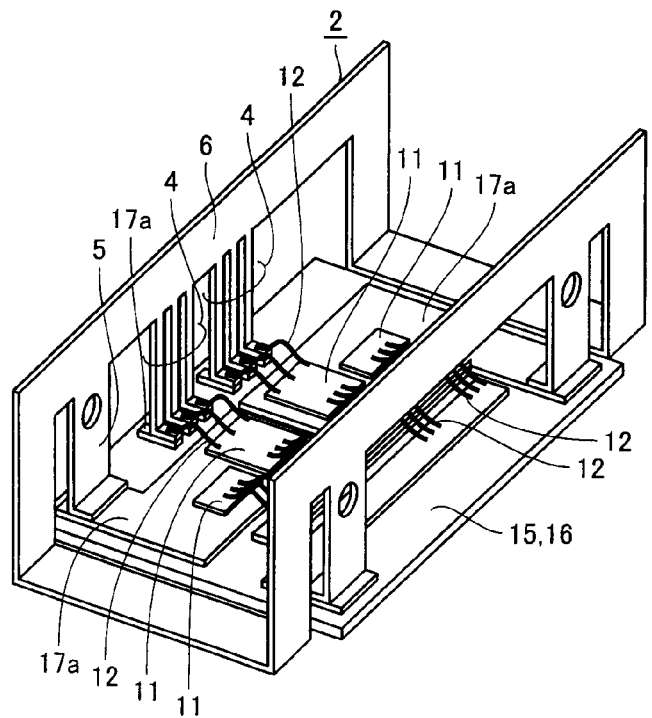
FIG. 43 is a perspective view showing a step performed after the steps shown in FIGS. 41 and 42 of Embodiment 3.
Figure 44:
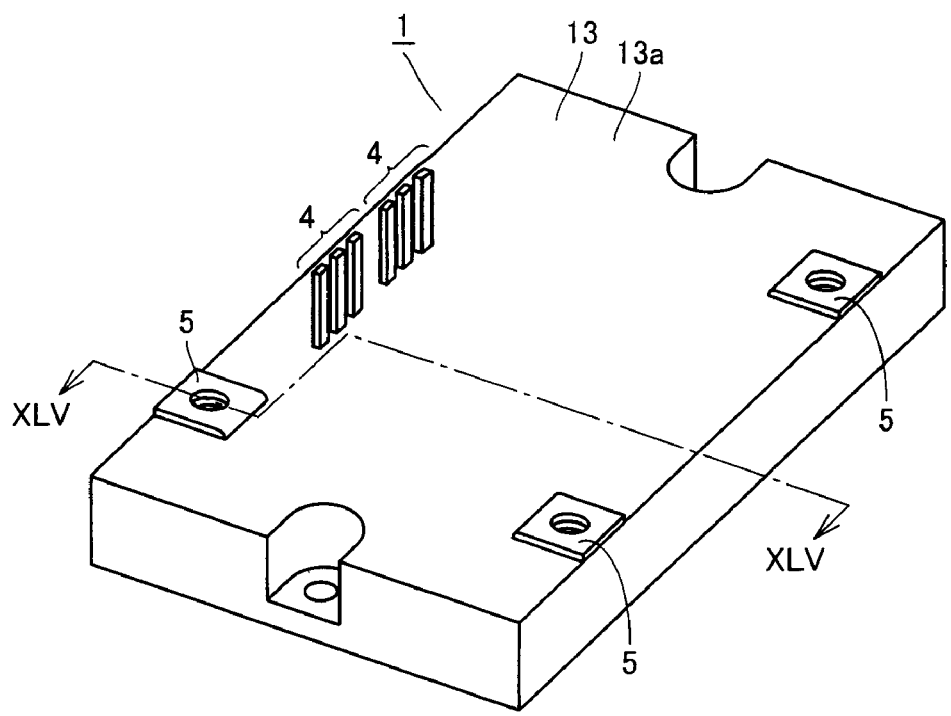
FIG. 44 is a perspective view showing a step performed after the step shown in FIG. 43 of Embodiment 3.
Figure 45:
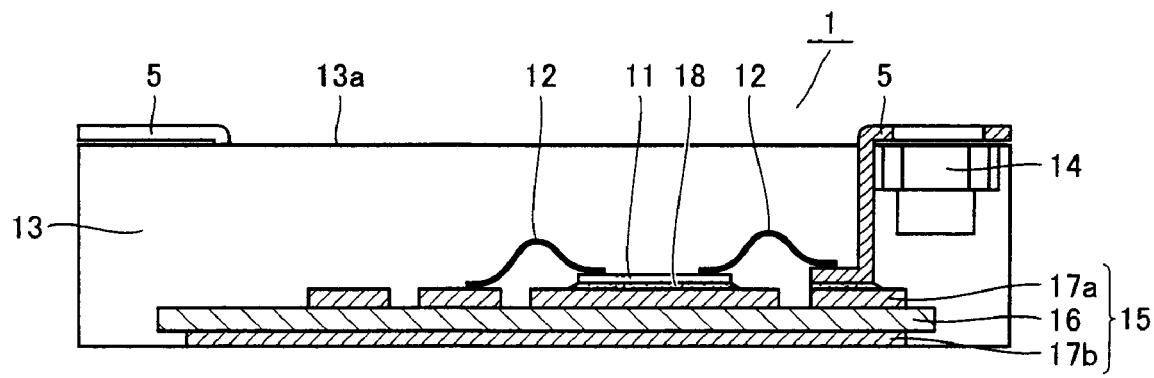
FIG. 45 is a cross-sectional view taken along the line XLV-XLV shown in FIG. 44 of Embodiment 3.

Next, as shown in FIG. 43, lead frame 2 is attached such that lead terminal 4 and main electrode terminal 5 are connected to corresponding copper pattern 17a. Lead terminal 4 and main electrode terminal 5 are connected by solder to the corresponding copper pattern 17a. Thereafter, through the steps similar to those shown in FIGS. 10 to 19, semiconductor device 1 having semiconductor chip 11 and ceramic substrate 15 (see FIG. 43) sealed with resin 13 is formed, as shown in FIGS. 44 and 45.

According to the method of manufacturing semiconductor device 1 described above, not only the expensive insert case but also the heat-radiating plate becomes unnecessary, and hence, manufacturing cost of semiconductor device 1 can further be reduced. Further, as already described, thickness of resin 13 of semiconductor device 1 can be reduced, which contributes to reduction in size of semiconductor device 1.

Embodiment 4

Figure 46:
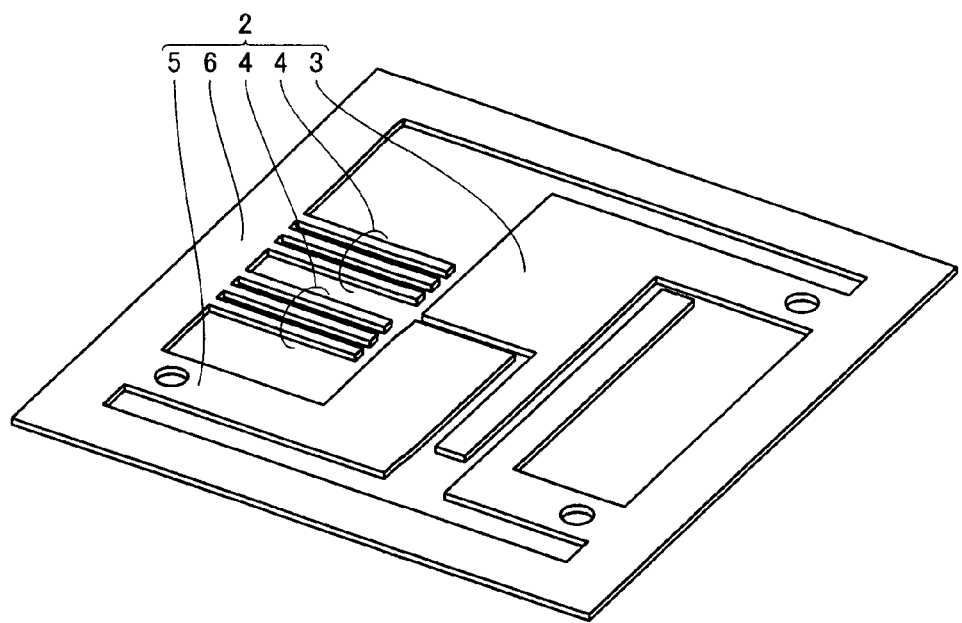
FIG. 46 is a perspective view showing a step of manufacturing a semiconductor device in accordance with Embodiment 4 of the present invention.
Figure 47:
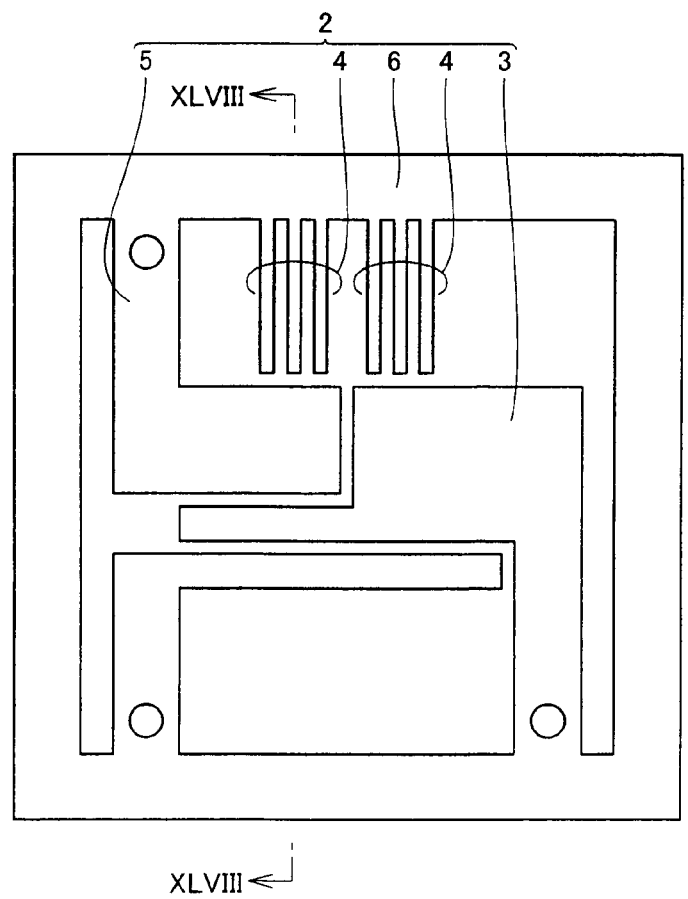
FIG. 47 is a plan view of the step shown in FIG. 46 of Embodiment 4.
Figure 48:
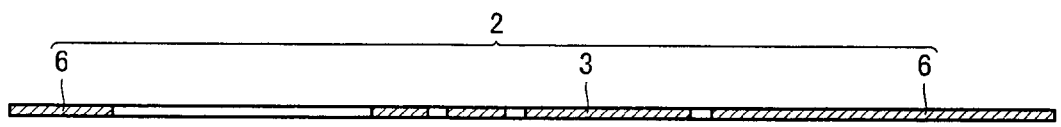
FIG. 48 is a cross-sectional view taken along the line XLVIII-XLVIII shown in FIG. 47 of Embodiment 4.

Here, a semiconductor device having a lead frame as the element-mounting member and not having a heat-radiating plate will be described. First, as shown in FIGS. 46, 47 and 48, lead frame 2 as the element-mounting member is prepared. Lead frame 2 is punched out to a prescribed pattern to provide a portion of frame body 3 on which a semiconductor chip is mounted, a portion to be a lead terminal 4, and a portion to be a main electrode terminal 5. These portions are connected to each other by a tie bar 6.

Figure 49:
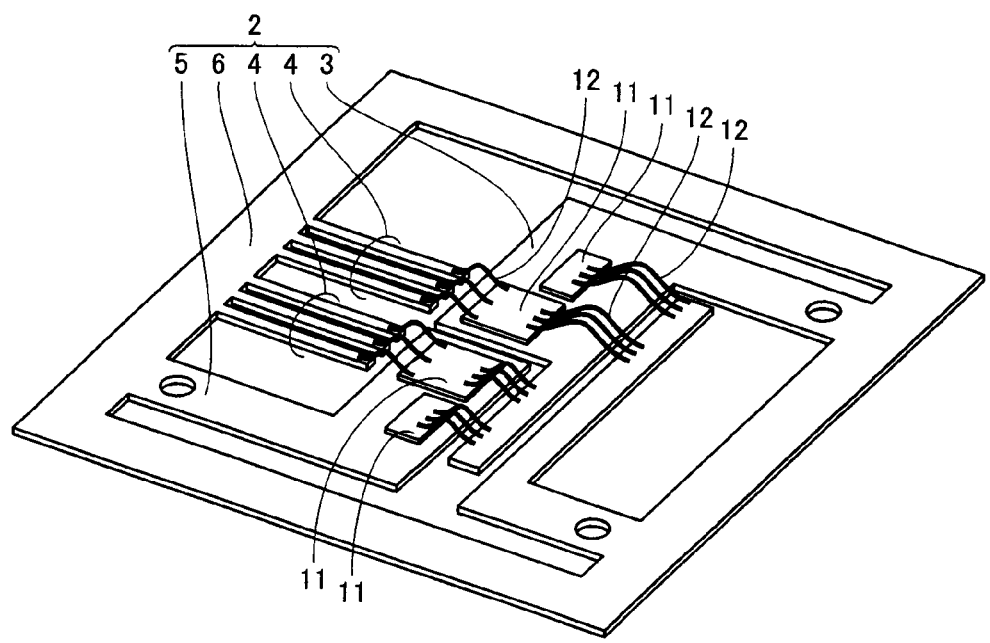
FIG. 49 is a perspective view showing a step performed after the steps shown in FIGS. 46 to 48 of Embodiment 4.
Figure 50:
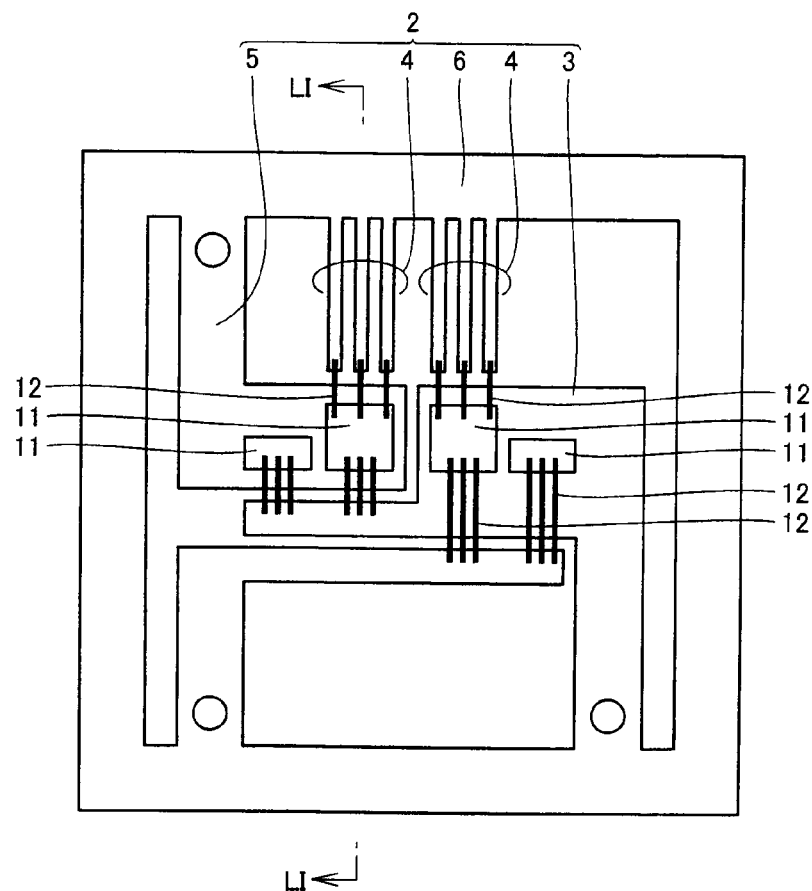
FIG. 50 is a plan view of the step shown in FIG. 49 of Embodiment 4.
Figure 51:
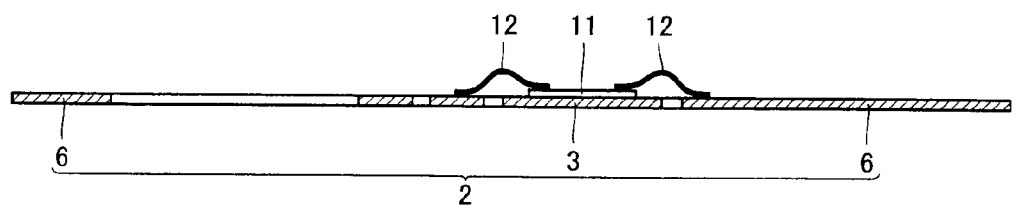
FIG. 51 is a cross-sectional view taken along the line LI-LI shown in FIG. 50 of Embodiment 4.
Figure 52:
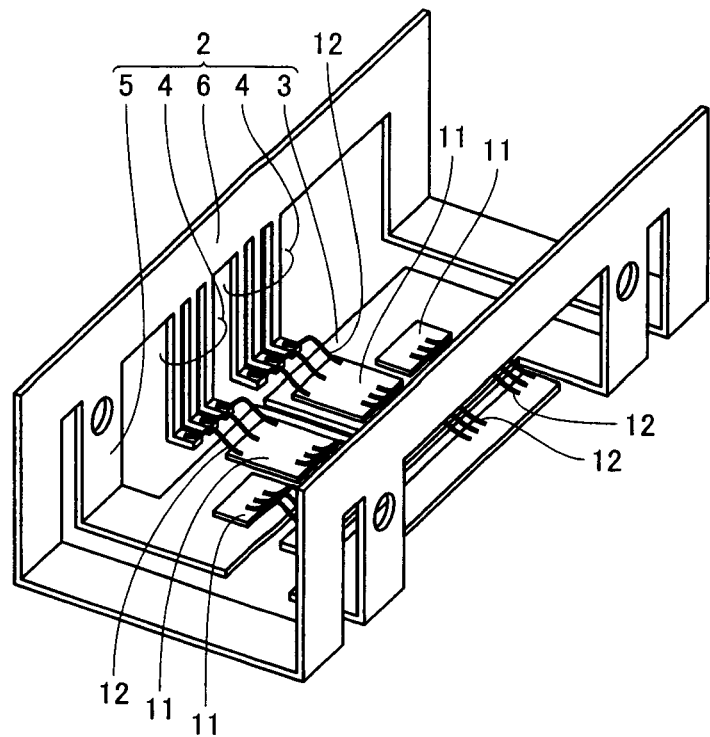
FIG. 52 is a perspective view showing a step performed after the steps shown in FIGS. 49 to 51 of Embodiment 4.
Figure 53:
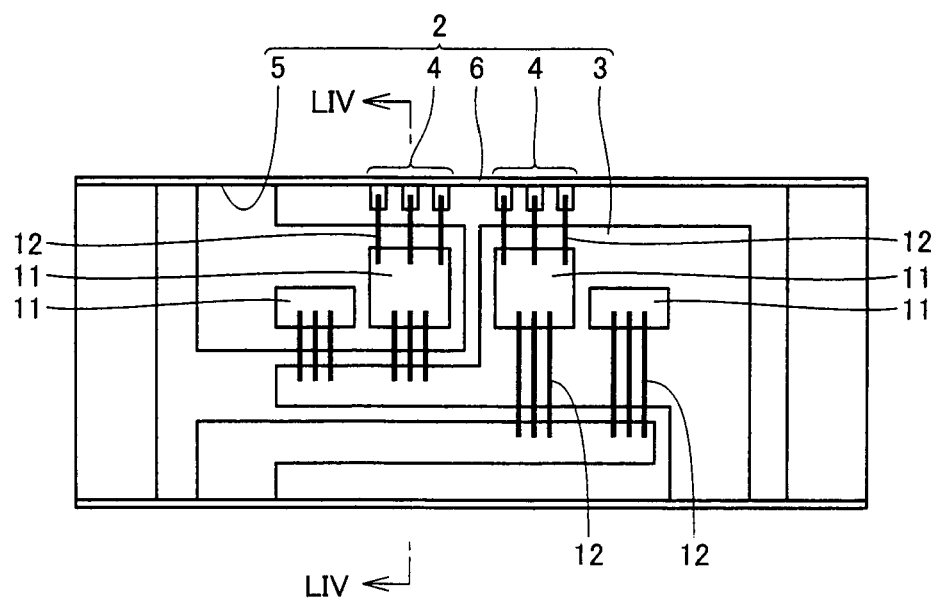
FIG. 53 is a plan view of the step shown in FIG. 52 of Embodiment 4.
Figure 54:
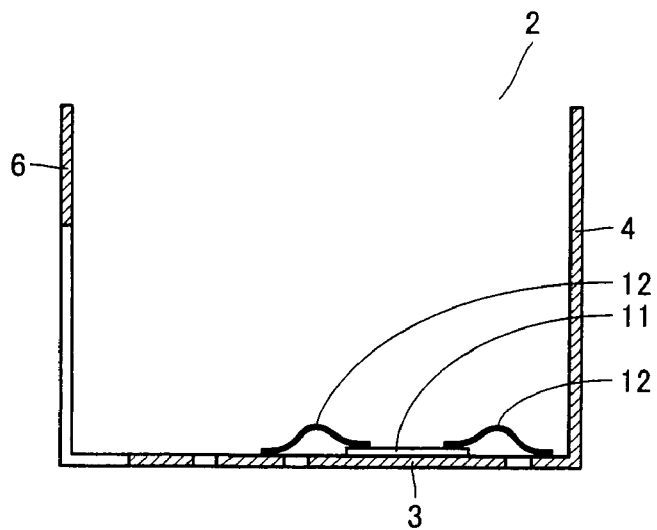
FIG. 54 is a cross-sectional view taken along the line LIV-LIV shown in FIG. 53 of Embodiment 4.
Figure 55:
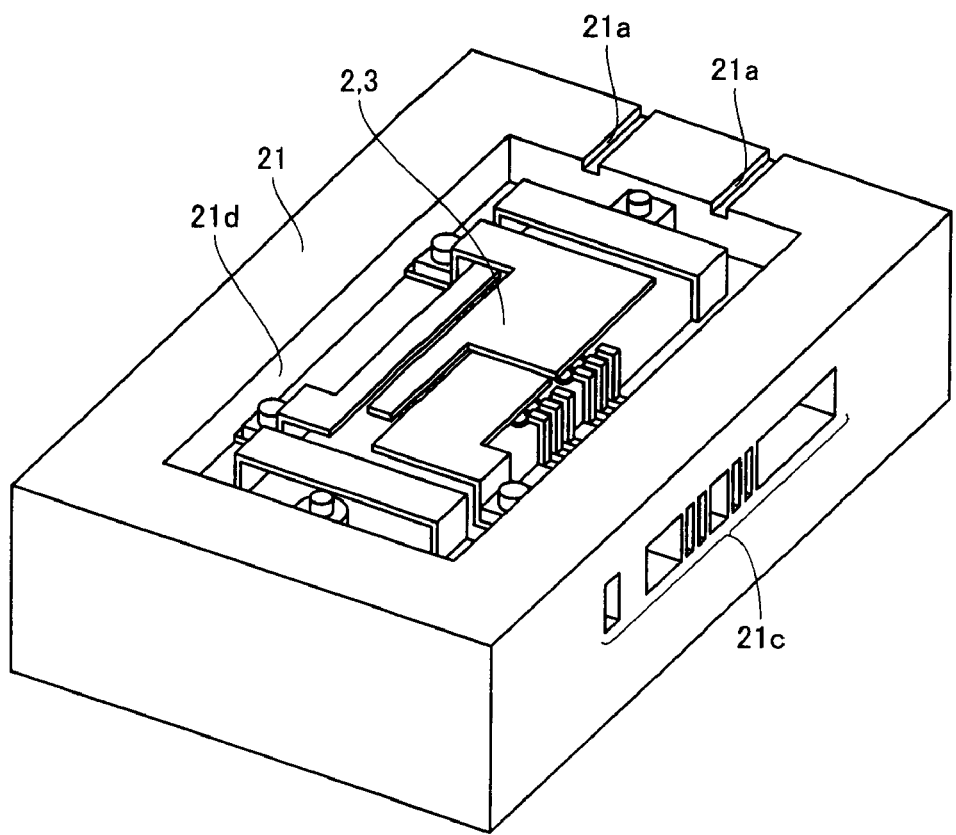
FIG. 55 is a perspective view showing a step performed after the steps shown in FIGS. 52 to 54 of Embodiment 4.
Figure 56:
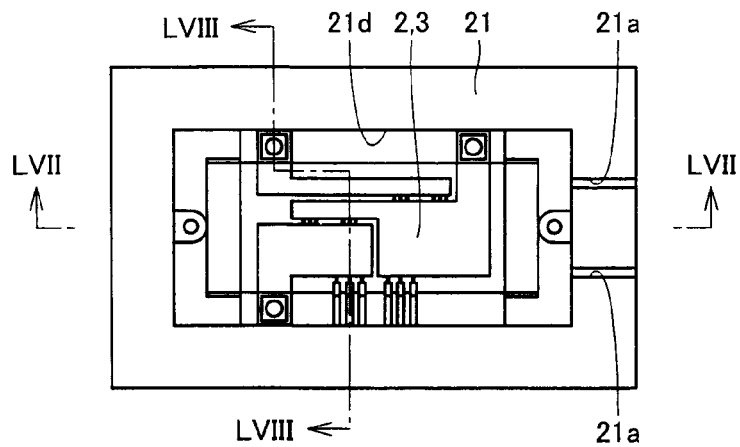
FIG. 56 is a plan view of the step shown in FIG. 55 of Embodiment 4.
Figure 57:
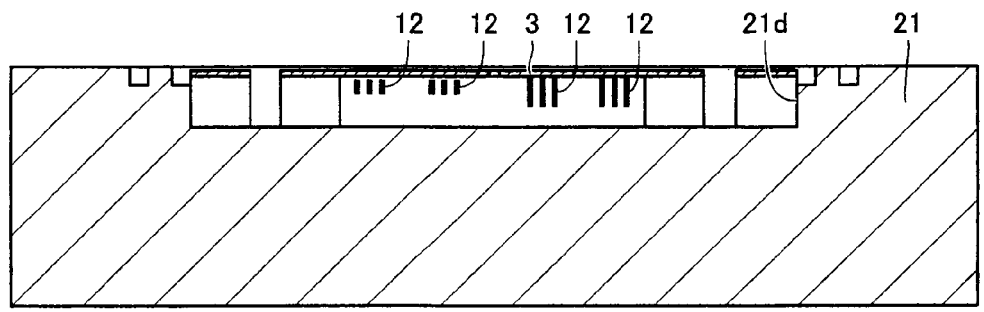
FIG. 57 is a cross-sectional view taken along the line LVII-LVII shown in FIG. 56 of Embodiment 4.
Figure 58:
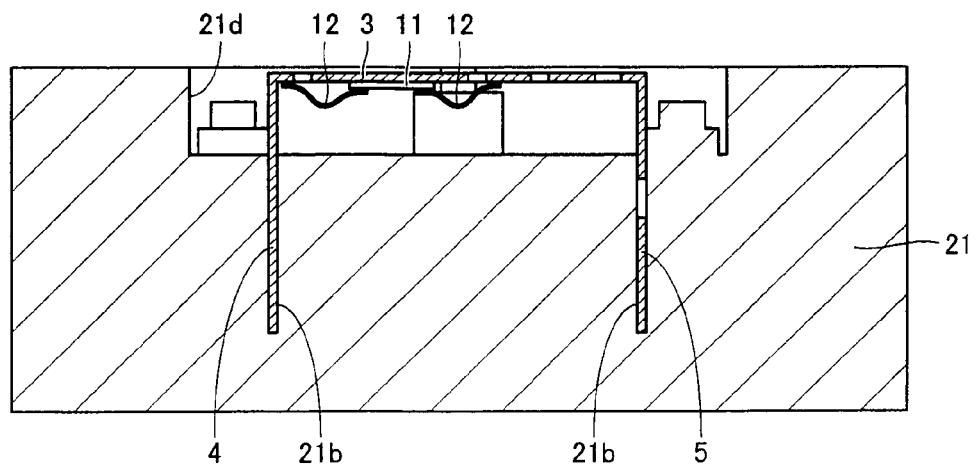
FIG. 58 is a cross-sectional view taken along the line LVIII-LVIII shown in FIG. 56 of Embodiment 4.

Next, as shown in FIGS. 49, 50 and 51, a semiconductor chip 11 such as an IGBT or a diode is adhered with solder at a prescribed position of frame body 3 (die-bonding). Next, a prescribed electrode of die-bonded semiconductor chip 11 and a corresponding lead terminal 4 or the like are electrically connected by a prescribed wire 12 (wire-bonding). Next, as shown in FIGS. 52, 53 and 54, portions to be lead terminal 4 and main electrode terminal 5 of lead frame 2 are bent upward with respect to frame body 3.

Next, an operation of sealing semiconductor chip 11 wire-bonded to lead terminal 4 and the like in this manner with a prescribed resin is performed. First, as shown in FIGS. 55, 56, 57 and 58, lead frame 2 is set in a recessed portion 21d of a first metal mold 21, with a rear surface of frame body 3, having semiconductor chip 11 mounted, facing upward. Here, tip end portions of lead terminal 4 and main electrode terminal 5 are inserted to reception openings 21b provided in first metal mold 21.

Figure 59:
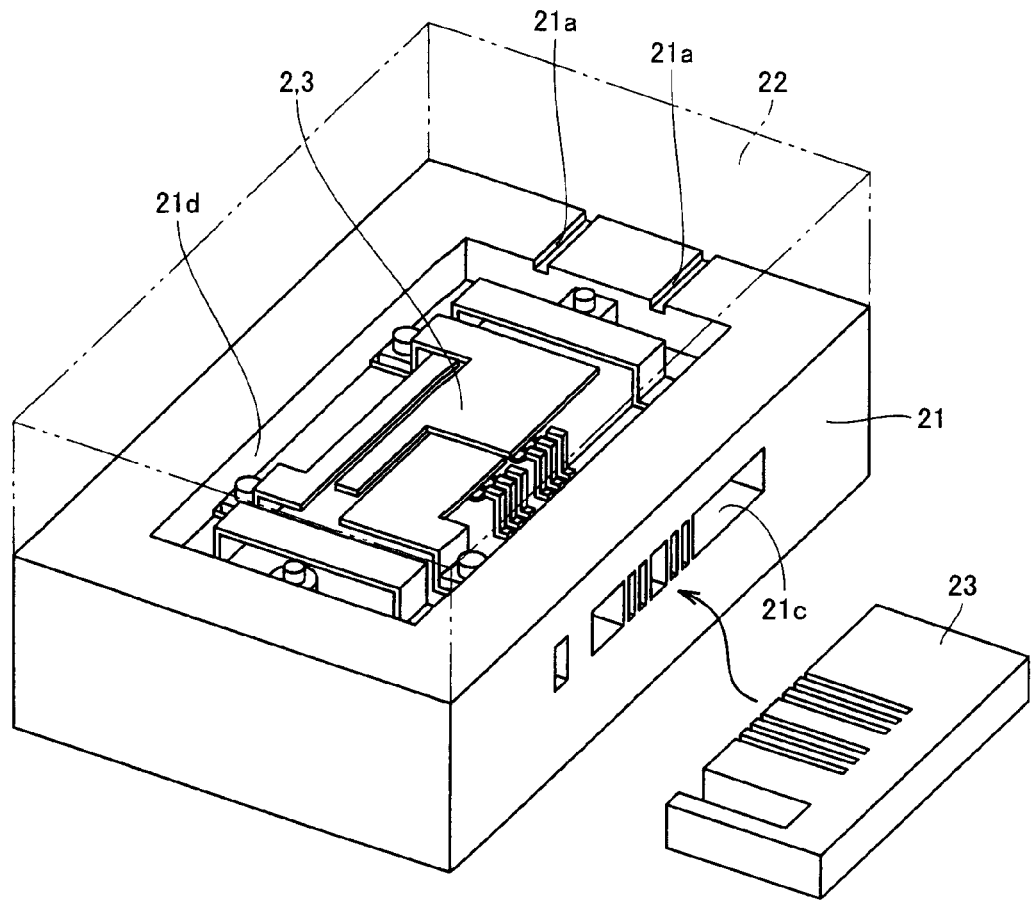
FIG. 59 is a perspective view showing a step performed after the steps shown in FIGS. 55 to 58 of Embodiment 4.
Figure 60:
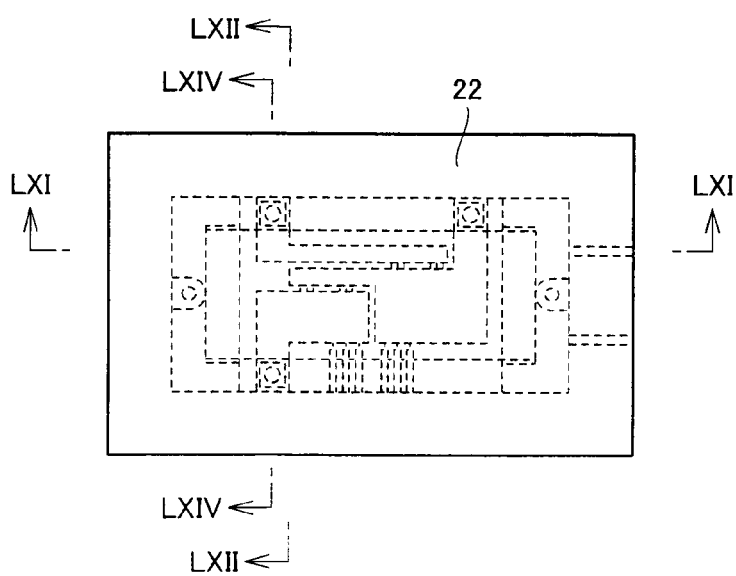
FIG. 60 is a plan view of the step shown in FIG. 59 of Embodiment 4.
Figure 61:
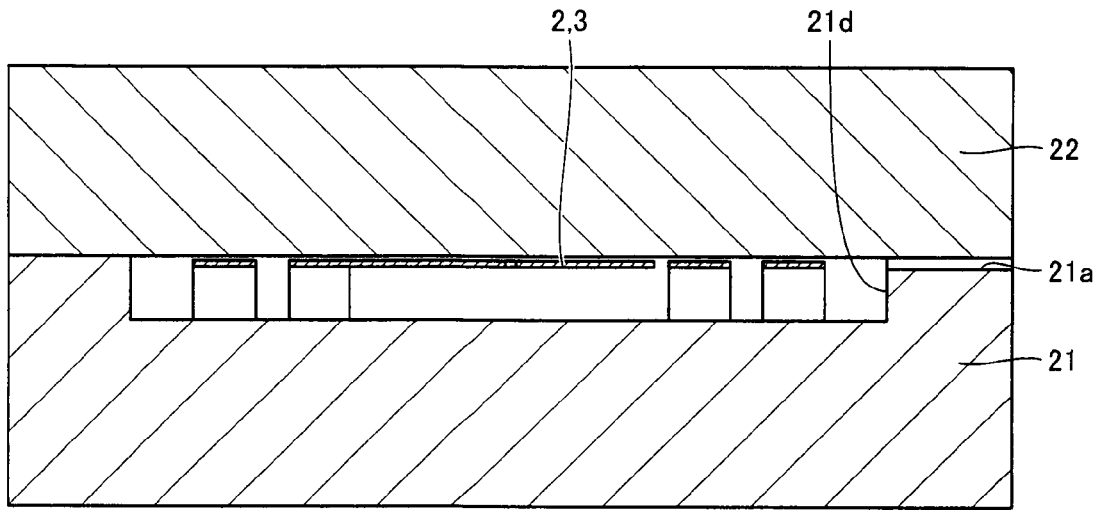
FIG. 61 is a cross-sectional view taken along the line LXI-LXI shown in FIG. 60 of Embodiment 4.
Figure 62:
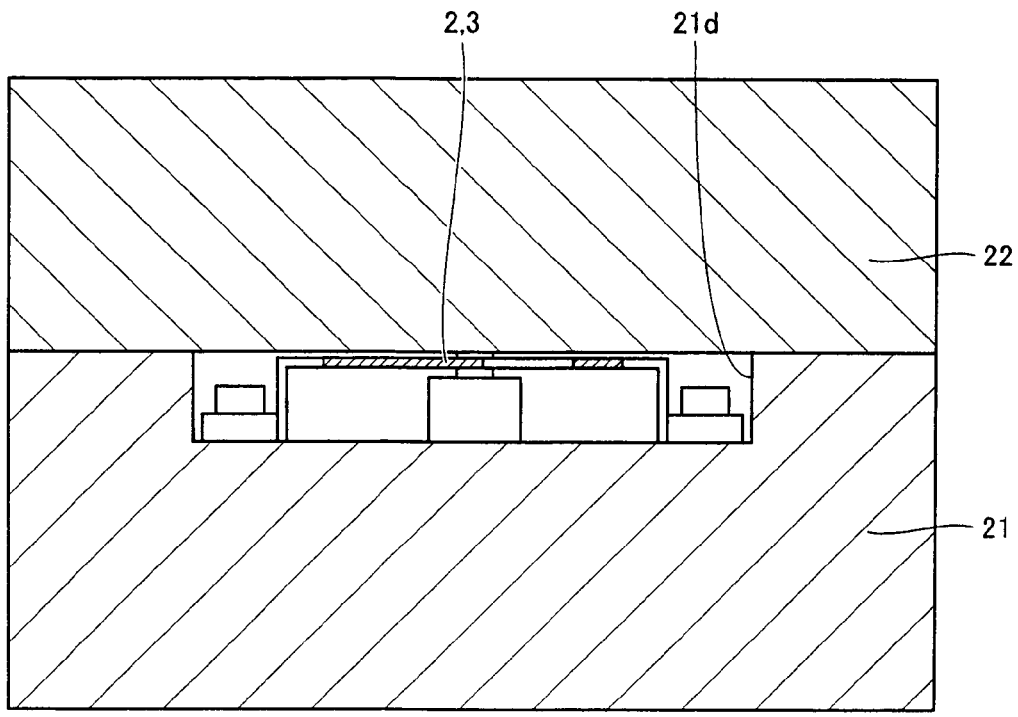
FIG. 62 is a cross-sectional view taken along the line LXII-LXII shown in FIG. 60 of Embodiment 4.

At this time, in the first metal mold 21, lead terminals 4 are tied by tie bar 6, and therefore, there is provided an opening 21c to which a prescribed sliding mold 23 is inserted to prevent the flow of resin. In the first metal mold 21 shown in FIG. 55 or 59, a similar opening (not shown) corresponding to the shape of lead frame 2 is formed also on a side surface opposite to the side surface having opening 21c formed therein, and the corresponding sliding mold (not shown) is inserted to the opening.

Next, as shown in FIGS. 59, 60, 61 and 62, second metal mold 22 is mounted on the first metal mold 21 such that lead frame 2 set in recessed portion of first metal mold 21 is enclosed in recessed portion 21d. Then, sliding mold 23 is inserted to opening 21c of the first metal mold 21.

Figure 63:
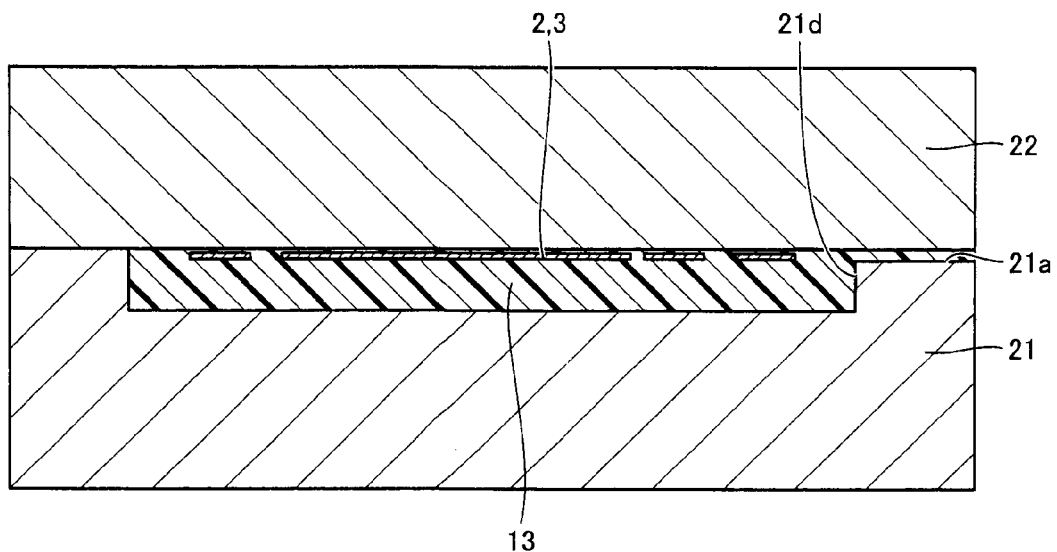
FIG. 63 is a cross-sectional view corresponding to the line LXI-LXI shown in FIG. 60, performed after the steps shown in FIGS. 59 to 62 of Embodiment 4.
Figure 64:
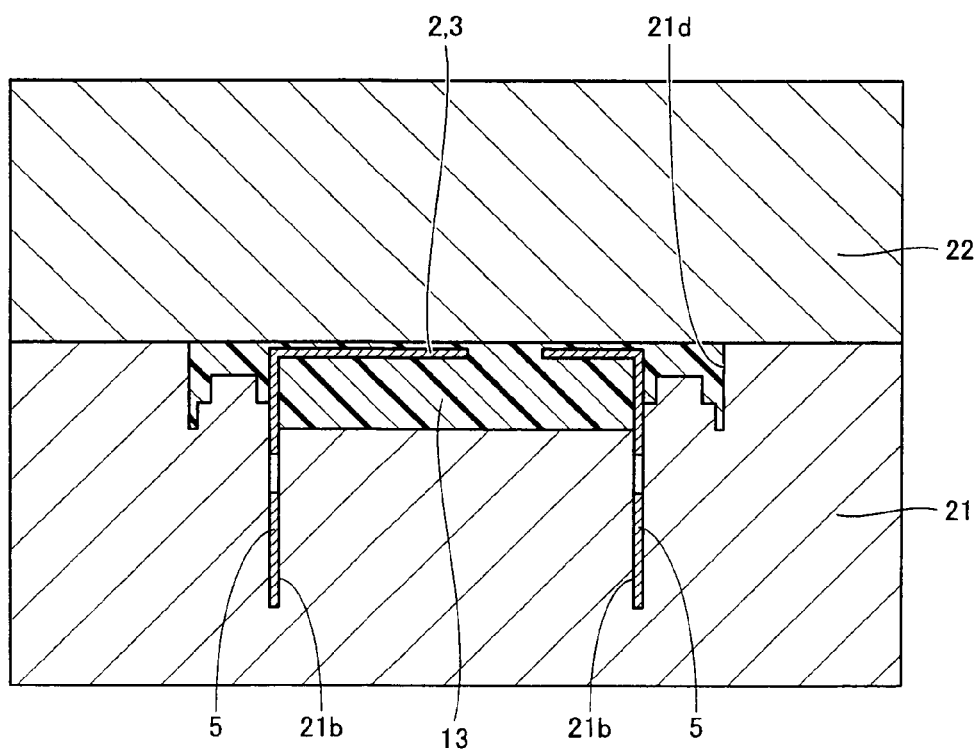
FIG. 64 is a cross-sectional view corresponding to the line LXIV-LXIV shown in FIG. 60, of the step shown in FIG. 63 of Embodiment 4.
Figure 65:
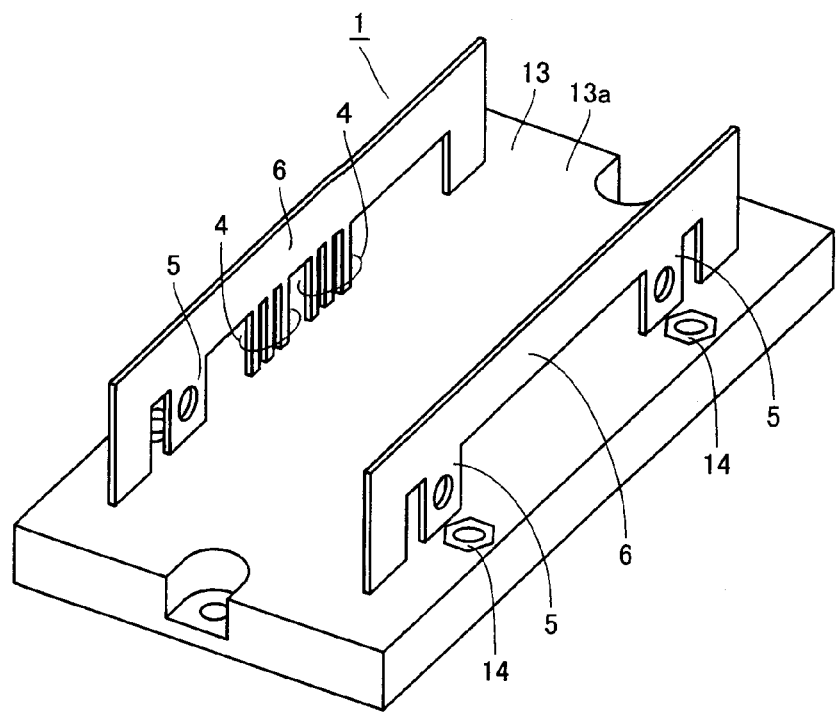
FIG. 65 is a perspective view showing a step performed after the steps shown in FIGS. 63 and 64 of Embodiment 4.

Next, as shown in FIGS. 63 and 64, thermoplastic resin 31 is introduced through gate 21a, and recessed portion 21d containing frame body 3 and the like is filled with resin 13. After the resin 13 is cured, the second metal mold 22 is separated from the first metal mold 21. Thus, semiconductor device 1 having semiconductor chip 11, frame body 3 and the like sealed with resin 13 is taken out, as shown in FIG. 65.

From the surface 13a of resin 13 that corresponds to the upper surface of semiconductor device 1, lead terminal 4, main electrode terminal 5 and tie bar 6 connecting these are exposed.

Figure 66:
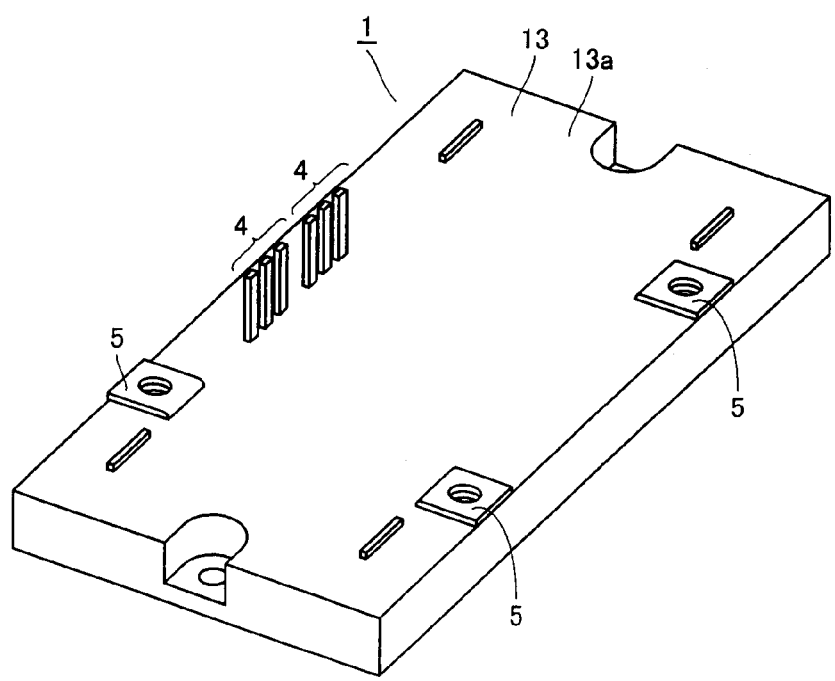
FIG. 66 is a perspective view showing a step performed after the step shown in FIG. 65 of Embodiment 4.
Figure 67:
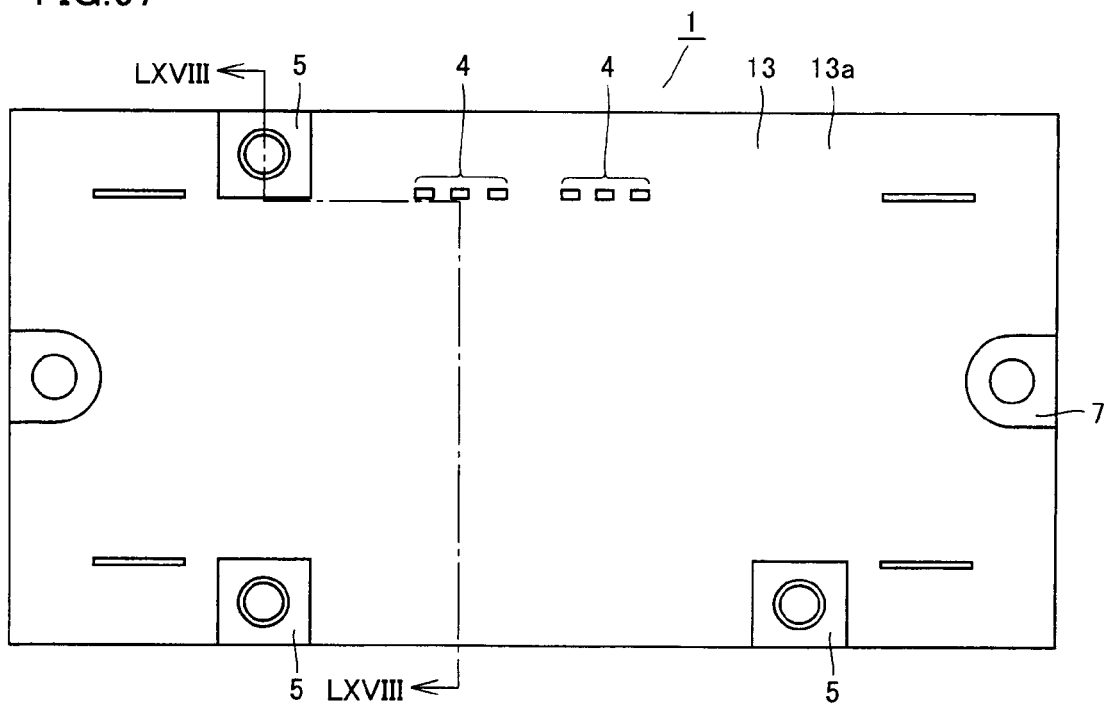
FIG. 67 is a plan view of the step shown in FIG. 66 of Embodiment 4.
Figure 68:
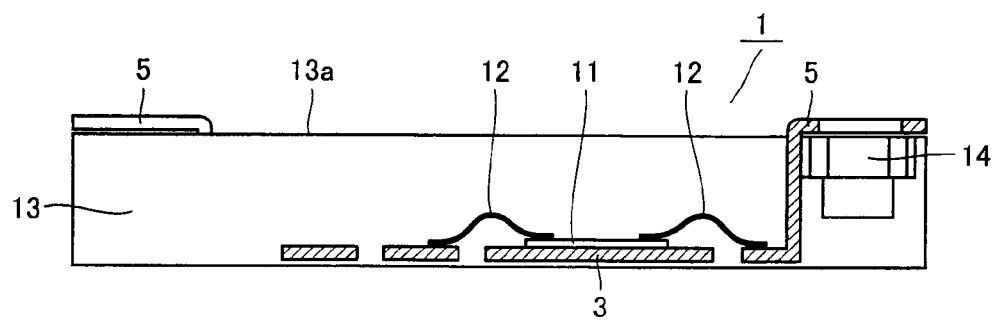
FIG. 68 is a cross-sectional view taken along the line LXVIII-LXVIII shown in FIG. 67 of Embodiment 4.

Next, tie bar 6 is cut, and as shown in FIGS. 66, 67 and 68, main electrode terminal 5 is bent to be parallel to the upper surface of resin 13, whereby semiconductor device 1 is finished. In the finished semiconductor device 1, main electrode terminal 5 and lead terminal 4 are exposed at the surface of resin 13, and the lead terminal and the like are not exposed at the side surface of resin 13. Further, as tie bar 6 is cut after sealing with resin 13, cross sections of cut tie bar 6 are exposed at the surface 13a of resin 13.

According to the method of manufacturing semiconductor device 1 described above, not only the expensive insert case but also the heat-radiating plate becomes unnecessary and, in addition, the number of steps in the assembly process can be reduced. Thus, the cost of manufacturing the semiconductor device 1 can further be reduced. Further, as already described, thickness of resin 13 of semiconductor device 1 can be reduced, which contributes to reduction in size of semiconductor device 1.

The semiconductor device according to the present invention may be effectively utilized as a semiconductor device for driving an inverter of industrial equipment and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
    preparing an element-mounting member on which a semiconductor element is mounted;
    preparing a lead frame including a pattern to be a connecting terminal, said lead frame including a frame body as said element-mounting member connected to said connecting terminal by a tie bar;
    mounting a semiconductor chip including a prescribed power element as said semiconductor element on said element-mounting member;
    connecting said semiconductor chip and said connecting terminal by a prescribed metal wire;
    processing said lead frame such that said connecting terminal is erected upward at a prescribed position with respect to said semiconductor chip;
    setting said lead frame and said element-mounting member in a prescribed metal mold to which a prescribed sealing resin for sealing said element-mounting member and said semiconductor chip is introduced, such that said element-mounting member and said semiconductor chip as a whole are covered at least from above and said erected connecting terminal protrudes upward from an upper surface of the sealing resin, and not from a side surface of the sealing resin;
    introducing said sealing resin to said metal mold; and
    taking said semiconductor chip sealed by said sealing resin, from said metal mold.

2. The method of manufacturing a semiconductor device according to claim 1, further comprising
    before the step of introducing said sealing resin, removing said tie bar; wherein
    in said step of introducing said sealing resin, said sealing resin is introduced with said tie bar removed.

3. The method of manufacturing a semiconductor device according to claim 1, comprising between said step of preparing said element-mounting member and said step of mounting said semiconductor chip, the step of mounting said element-mounting member on one surface of a heat-radiating plate.

4. A semiconductor device, comprising:

an element-mounting member on which a prescribed semiconductor element is mounted;

a semiconductor chip mounted on a prescribed position of said element-mounting member, and including a prescribed power element as said semiconductor element;

a connecting terminal erected upward at a prescribed position with respect to said semiconductor chip and electrically connected to said semiconductor chip; and a sealing resin covering said element-mounting member and said semiconductor chip as a whole from above, and sealing said element-mounting member and said semiconductor chip such that said erected connecting terminal is protruded upward from an upper surface of the sealing resin, and not from a side surface of the sealing resin, and said erected connecting terminal includes a circular opening configured to receive a bolt, wherein the prescribed semiconductor element comprises first and second semiconductor chips, and said element-mounting member comprises separate first and second portions onto which said first and second semiconductor chips are respectively mounted.

5. The semiconductor device according to claim 4, wherein said element-mounting member and said connecting terminal are formed of a lead frame.

6. The semiconductor device according to claim 4, wherein a heat-radiating plate is arranged on a side of said element-mounting member opposite to the side on which said semiconductor chip is mounted.

7. The semiconductor device according to claim 4, wherein said first portion of said element mounting member includes a first protruding portion that protrudes at the portion covered from above, and said second portion of said element mounting member includes a second protruding portion that protrudes at the portion covered from above.

8. A semiconductor device, comprising:

an element-mounting member on which a prescribed semiconductor element is mounted;

a semiconductor chip mounted on a prescribed position of said element-mounting member, and including a prescribed power element as said semiconductor element;

a connecting terminal erected upward at a prescribed position with respect to said semiconductor chip and electrically connected to said semiconductor chip; and a sealing resin covering said element-mounting member and said semiconductor chip as a whole from above, and sealing said element-mounting member and said semiconductor chip such that said erected connecting terminal is protruded upward from an upper surface of the sealing resin, and not from a side surface of the sealing resin, wherein the prescribed semiconductor element comprises first and second semiconductor chips, and said element-mounting member comprises separate first and second portions onto which said first and second semiconductor chips are respectively mounted said first portion of said element mounting member includes a first protruding portion that protrudes at the portion covered from above, and said second portion of said element mounting member includes a second protruding portion that protrudes at the portion covered from above, and the protruding first and second portions each include a circular opening configured to receive a bolt for fixing a bus bar.

* * * * *